(12) United States Patent
Baek et al.

(10) Patent No.: US 12,238,878 B2
(45) Date of Patent: Feb. 25, 2025

(54) ELECTRONIC DEVICE INCLUDING CONDUCTIVE CONNECTION MEMBER

(71) Applicant: Samsung Electronics Co., Ltd., Suwon-si (KR)

(72) Inventors: Seungchang Baek, Suwon-si (KR); Hyeongsam Son, Suwon-si (KR); Changhyeok Shin, Suwon-si (KR); Yoonhee Lee, Suwon-si (KR); Junghyun Im, Suwon-si (KR); Sungho Cho, Suwon-si (KR); Jungwoo Choi, Suwon-si (KR); Hangyu Hwang, Suwon-si (KR); Minwoo Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 379 days.

(21) Appl. No.: 17/894,543

(22) Filed: Aug. 24, 2022

(65) Prior Publication Data
US 2023/0141690 A1    May 11, 2023

Related U.S. Application Data

(63) Continuation of application No. PCT/KR2022/012305, filed on Aug. 18, 2022.

(30) Foreign Application Priority Data

Nov. 10, 2021    (KR) .......................... 10-2021-0154237

(51) Int. Cl.
*H01Q 1/24*    (2006.01)
*H05K 5/02*    (2006.01)

(52) U.S. Cl.
CPC ........... *H05K 5/0217* (2013.01); *H01Q 1/243* (2013.01)

(58) Field of Classification Search
CPC ............................ H05K 5/0217; H01Q 1/243
See application file for complete search history.

(56) References Cited

U.S. PATENT DOCUMENTS

| 9,293,806 | B2 | 3/2016 | Kwong et al. |
| 9,653,778 | B2 | 5/2017 | Kwong et al. |
| (Continued) | | | |

FOREIGN PATENT DOCUMENTS

| KR | 10-1465421 B1 | 11/2014 |
| KR | 10-2015-0099329 A | 8/2015 |
| (Continued) | | |

OTHER PUBLICATIONS

International Search Report dated Dec. 14, 2022, issued in International Patent Application No. PCT/KR2022/012305.

*Primary Examiner* — Graham P Smith
(74) *Attorney, Agent, or Firm* — Jefferson IP Law, LLP

(57) ABSTRACT

An electronic device is provided. The electronic device includes a display, a frame structure including a first conductive member defining an external appearance of the electronic device and operated as an antenna element of the electronic device, a second conductive member coupled and electrically connected to the first conductive member, and a nonconductive member that supports the display together with the second conductive member, a bonding layer including a first layer at least partially disposed between the first conductive member and the nonconductive member, and a second layer at least partially disposed between the second conductive member and the nonconductive member, and at least one conductive connection member disposed at a portion, at which the first conductive member and the second conductive member are coupled to each other, and contacting the first conductive member and the second conductive member.

20 Claims, 23 Drawing Sheets

(56) References Cited

U.S. PATENT DOCUMENTS

| | | |
|---|---|---|
| 9,832,292 B2 | 11/2017 | Moon |
| 10,201,102 B2 | 2/2019 | Lee et al. |
| 10,462,917 B2 | 10/2019 | Lee et al. |
| 10,666,779 B2 | 5/2020 | Shin et al. |
| 11,189,909 B2 | 11/2021 | Leutheuser et al. |
| 11,258,163 B2 | 2/2022 | Froese et al. |
| 2015/0245513 A1 | 8/2015 | Moon |
| 2015/0255853 A1 | 9/2015 | Kwong et al. |
| 2016/0044801 A1 | 2/2016 | Lee et al. |
| 2016/0164165 A1 | 6/2016 | Kwong et al. |
| 2017/0188475 A1 | 6/2017 | Lee et al. |
| 2019/0104211 A1 | 4/2019 | Shin et al. |
| 2020/0076056 A1 | 3/2020 | Froese et al. |
| 2020/0076057 A1 | 3/2020 | Leutheuser et al. |
| 2021/0105894 A1 | 4/2021 | Oh et al. |
| 2022/0006176 A1 | 1/2022 | Froese et al. |

FOREIGN PATENT DOCUMENTS

| | | |
|---|---|---|
| KR | 10-2016-0019248 A | 2/2016 |
| KR | 10-1618694 B1 | 5/2016 |
| KR | 10-2016-0099264 A | 8/2016 |
| KR | 10-2017-0070667 A | 6/2017 |
| KR | 10-2020-0026000 A | 3/2020 |
| KR | 10-2021-0040699 A | 4/2021 |
| KR | 10-2022-0142173 A | 10/2022 |

ELECTRONIC DEVICE INCLUDING CONDUCTIVE CONNECTION MEMBER

CROSS-REFERENCE TO RELATED APPLICATION(S)

This application is a continuation application, claiming priority under § 365(c), of an International application No. PCT/KR2022/012305, filed on Aug. 18, 2022, which is based on and claims the benefit of a Korean patent application number 10-2021-0154237, filed on Nov. 10, 2021, in the Korean Intellectual Property Office, the disclosure of which is incorporated by reference herein in its entirety.

TECHNICAL FIELD

The disclosure relates to an electronic device including a conductive connection member.

BACKGROUND ART

An electronic device may include a housing that defines an external appearance. The housing may include a metal part. The metal part may constitute an antenna structure of the electronic device. For example, the electronic device may perform wireless communication by using the metal part as an antenna radiator.

Meanwhile, the metal part of the housing, which constitutes the antenna structure, may have two members. For example, the metal part of the housing may include a first member that constitutes an outer periphery of the electronic device, and a second member that is located inside the first member. In this case, it is required to electrically connect the first member and the second member to use the metal part as the antenna. Accordingly, the first member and the second member may be welded to be physically and chemically bonded to each other, or contact each other through a physical connection structure to electrically connect each other.

The above information is presented as background information only to assist with an understanding of the disclosure. No determination has been made, and no assertion is made, as to whether any of the above might be applicable as prior art with regard to the disclosure.

DISCLOSURE

Technical Problem

An electrical connection may vary according to a coupling quality of the first member and the second member that constitute the housing. For example, when the two members are welded and bonded to each other, the electrical connection between the first member and the second member may be degraded due to a crack of a welded part or fine coming-over of a periphery of the welded part. As the electrical connection is degraded, performances of antennas using the first member and the second member may be degraded.

A housing may have one member to prevent and/or decrease degradation of antenna performance, but manufacturing costs may be increased.

A pressed piece of sheet metal may be applied to the second member located inside the first member. In this case, a contact point between the first member and the second member may become vulnerable according to a condition and an environment of a process. For example, a welding deformation may occur or a fine gap may be caused due to a small thickness of a pressed sheet.

Unlike the pressed piece of sheet metal, a second member manufactured through die casting may be applied to an inside of the first member. In this case, the contact point between the first member and the second member may be short-circuited according to a pore defect of a die casting process and a welding state.

An electrical contact vulnerable part between the first member and the second member may cause an antenna performance defect, and thus manufacturing costs may be increased.

Aspects of the disclosure are to address at least the above-mentioned problems and/or disadvantages and to provide at least the advantages described below. Accordingly, an aspect of the disclosure is to provide an electronic device that includes a conductive connection member disposed in a coupling part of a first conductive member and a second conductive member, which constitute a housing, to enhance an electrical connection between the first conductive member and the second conductive member and prevent and/or decrease an antenna performance defect.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a display, a frame structure including a first conductive member defining an external appearance of the electronic device and operated as an antenna element of the electronic device, a second conductive member coupled and electrically connected to the first conductive member, and a nonconductive member that supports the display together with the second conductive member, a bonding layer including a first layer at least partially disposed between the first conductive member and the nonconductive member, and a second layer at least partially disposed between the second conductive member and the nonconductive member, and at least one conductive connection member disposed at a portion, at which the first conductive member and the second conductive member are coupled to each other, and contacting the first conductive member and the second conductive member.

In accordance with another aspect of the disclosure, an electronic device is provided. The electronic device includes a display, a frame structure, the frame structure includes a first conductive member operated as an antenna element of the electronic device, the first conductive member includes an outer part defining a side surface of the electronic device, and a coupling part extending from the outer part to an inside of the electronic device, a second conductive member electrically connected to the first conductive member, the second conductive member includes an inner part that supports the display, and at least one end part extending from the inner part and coupled to the coupling part of the first conductive member, and a nonconductive member at least partially surrounding the first conductive member and the second conductive member, and that supports the display together with the second conductive member, a bonding layer at least partially disposed between the first conductive member and the nonconductive member, and at least partially between the second conductive member and the nonconductive member, and at least one conductive connection member disposed at a portion, at which the coupling part of the first conductive member and the at least one end part of the second conductive member are coupled to each other, and contacting the first conductive member and the second conductive member.

Advantageous Effects

According to the disclosure, a deviation of antenna performances due to a deviation of coupling qualities of the first conductive member and the second conductive member used as antennas may be reduced.

According to the disclosure, degradation of antenna performances due to a coupling defect of the first conductive member and the second conductive member may be prevented and/or alleviated.

According to the disclosure, costs may be reduced through simplification of a manufacturing process for the frame structure and reduction of manufacturing costs.

According to the disclosure, because the support part of the frame structure may be formed through the second conductive member including the pressed piece of sheet metal and the nonconductive member, the manufacturing process for the frame structure may be simplified and costs of the frame structure may be reduced.

According to the disclosure, the electronic device may be light-weighted.

According to the disclosure, because the support part of the frame structure is formed through the second conductive member including the pressed piece of sheet metal, and the nonconductive member, the electronic device may be light-weighted.

According to the disclosure, a yield rate of the frame structure may be enhanced, and losses due to degradation of the yield rate may be reduced.

According to the disclosure, a yield rate of the frame structure may be enhanced through the conductive connection member that electrically connects the first conductive member and the second conductive member of the frame structure, and losses due to degradation of the yield rate may be reduced.

According to the disclosure, an efficiency of a manufacturing process for the frame structure may be increased.

According to the disclosure, a process and a quality may be easily managed through the conductive connection member, in which a color is implemented, and an efficiency of the manufacturing process for the frame structure may be increased.

According to the disclosure, a durability of a bonding part of the first conductive member and the second conductive member used as antennas may be enhanced.

According to the disclosure, the bonding part may be protected from an external environment through the conductive connection member that covers the bonding part of the first conductive member and the second conductive member used as antennas, and the durability of the bonding part may be enhanced.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
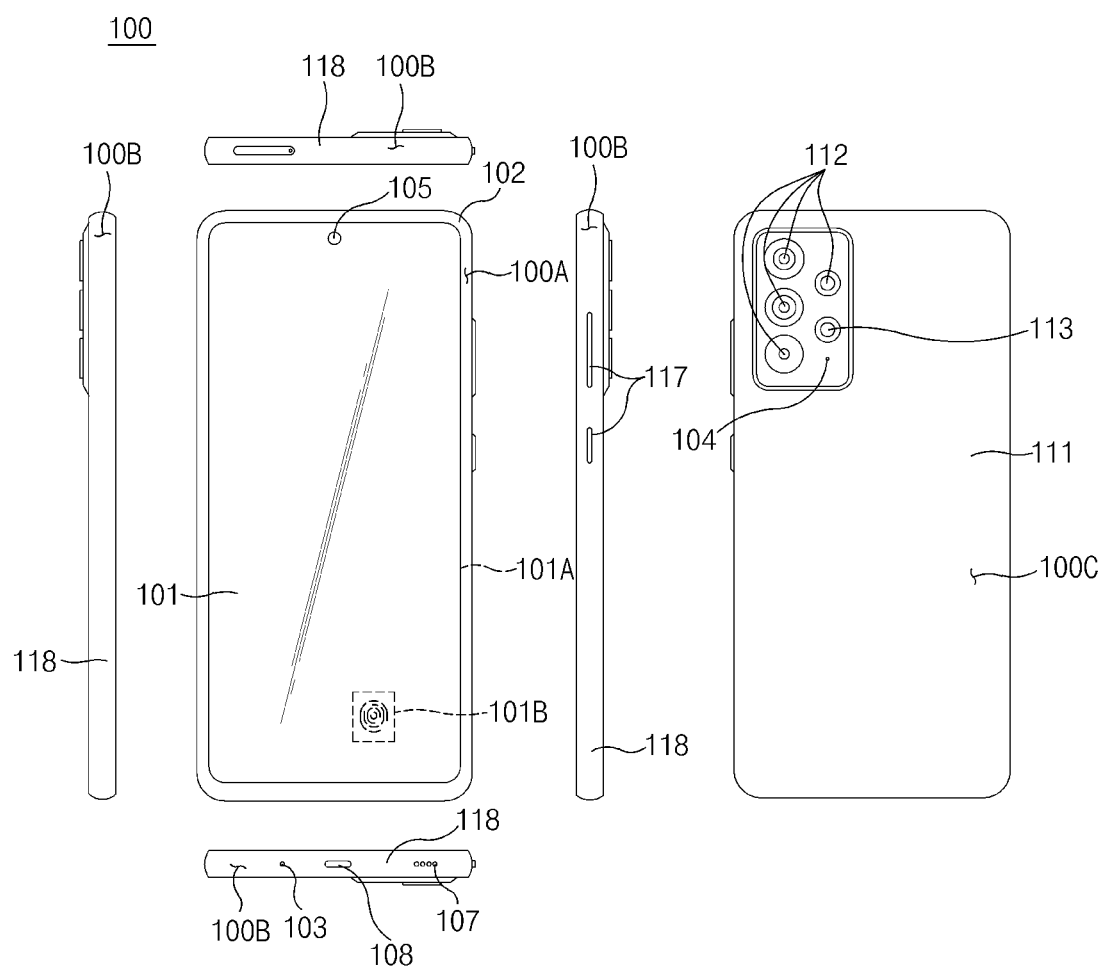
FIG. 1 is a view illustrating an electronic device according to an embodiment of the disclosure.

FIG. 1 is a view illustrating an electronic device according to an embodiment of the disclosure.

Referring to FIG. 1, an electronic device 100 according to an embodiment may include a housing that defines an external appearance of the electronic device 100. For example, the housing may include a first surface (or a front surface) 100A, a second surface (or a rear surface) 100B, and a third surface (or a side surface) 100C surrounding a space between the first surface 100A and the second surface 100B. In an embodiment, the housing may refer to a structure (e.g., a frame structure 140 of FIG. 3A) that defines at least some of the first surface 100A, the second surface 100B, and/or the third surface 100C.

The electronic device 100 according to an embodiment may include a front plate 102 that is substantially transparent. According to an embodiment, the front plate 102 may define at least a portion of the first surface 100A. In an embodiment, the front plate 102, for example, may include a glass plate or a polymer plate including various coating layers, but the disclosure is not limited thereto.

The electronic device 100 according to an embodiment may include a rear plate 111 that is substantially opaque. According to an embodiment, the rear plate 111 may define at least a portion of the second surface 100B. In an embodiment, the rear plate 111, for example, may be formed of coated or colored glass, ceramics, a polymer, a metal (e.g., aluminum, stainless steel (STS), or magnesium), or a combination of at least two thereof.

Figure 3A:
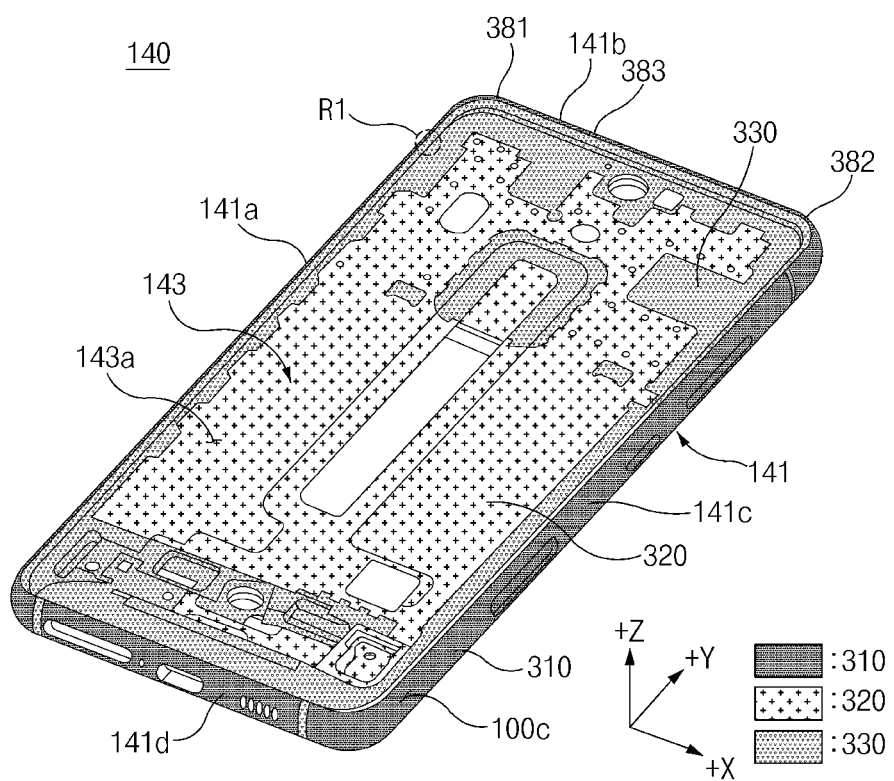
FIG. 3A is a first perspective view of a frame structure according to an embodiment of the disclosure.

The electronic device 100 according to an embodiment may include a side bezel structure (or a side member) 118 (e.g., a side wall 141 of the frame structure 140 of FIG. 3A). In an embodiment, the side bezel structure 118 may be coupled to the front plate 102 and/or the rear plate 111 to define at least a portion of the third surface 100C of the electronic device 100. For example, the side bezel structure 118 may define the entire third surface 100C of the electronic device 100, and as another example, the side bezel structure 118 may define the third surface 100C of the electronic device 100 together with the front plate 102 and/or the rear plate 111.

Unlike the illustrated embodiment, when the third surface 100C of the electronic device 100 is partially defined by the front plate 102 and/or the rear plate 111, the front plate 102 and/or the rear plate 111 may include an area that is deflected from a periphery thereof toward the rear plate 111 and/or the front plate 102 and extends seamlessly. The extending area of the front plate 102 and/or the rear plate 111, for example, may be located at opposite ends of a long edge of the electronic device 100, but is not limited to the above-described example.

In an embodiment, the side bezel structure 118 may include a metal and/or a polymer. In an embodiment, the rear plate 111 and the side bezel structure 118 may be integrally formed and may include the same material (e.g., a metallic material such as aluminum), but is not limited thereto. For example, the rear plate 111 and the side bezel structure 118 may be formed as separate configurations, and/or may include different materials.

In an embodiment, the electronic device 100 may include at least one of a display 101, audio modules 103, 104, and 107, a sensor module (not illustrated), camera modules 105, 112, and 113, a key input device 117, a light emitting element (not illustrated), and/or a connector hole 108. In another embodiment, at least one (e.g., the key input device 117 or the light emitting element (not illustrated)) of the elements may be omitted from the electronic device 100 or another component may be additionally included in the electronic device 100.

In an embodiment, the display 101 (e.g., a display module 1360 of FIG. 13) may be visually exposed through a considerably large portion of the front plate 102. For example, at least a portion of the display 101 may be viewed through the front plate 102 that defines the first surface 100A. In an embodiment, the display 101 may be disposed on a rear surface of the front plate 102.

In an embodiment, the display 101 may have an outskirt shape that is substantially the same as an outskirt shape of the front plate 102 that is adjacent to the display 101. In an embodiment, in order to expand the area, by which the display 101 is visually exposed, the intervals between the outskirts of the display 101 and the outskirts of the front plate 102 may be substantially the same.

In an embodiment, the display 101 (e.g., the first surface 100A of the electronic device 100) may include a screen display area 101A. In an embodiment, the display 101 may provide visual information to a user through the screen display area 101A. In the illustrated embodiment, it is illustrated that the screen display area 101A is spaced apart from an outskirt of the first surface 100A to be located inside the first surface 100A when the first surface 100A is viewed from a front side, but the disclosure is not limited thereto. In another embodiment, when the first surface 100A is viewed from the front side, at least a portion of a periphery of the screen display area 101A may substantially coincide with a periphery of the first surface 100A (or the front plate 102).

In an embodiment, the screen display area 101A may include a sensing area 101B that is configured to acquire biometric information of a user. Here, the expression that "the screen display area 101A includes the sensing area 101B" may be understood that at least a portion of the sensing area 101B may overlap the screen display area 101A. For example, the sensing area 101B may display visual information on the display 101 like other areas of the screen display area 101A, and additionally, may mean an area that may acquire biometric information (e.g., a fingerprint) of the user. In another embodiment, the sensing area 101B also may be formed in the key input device 117.

Figure 13:
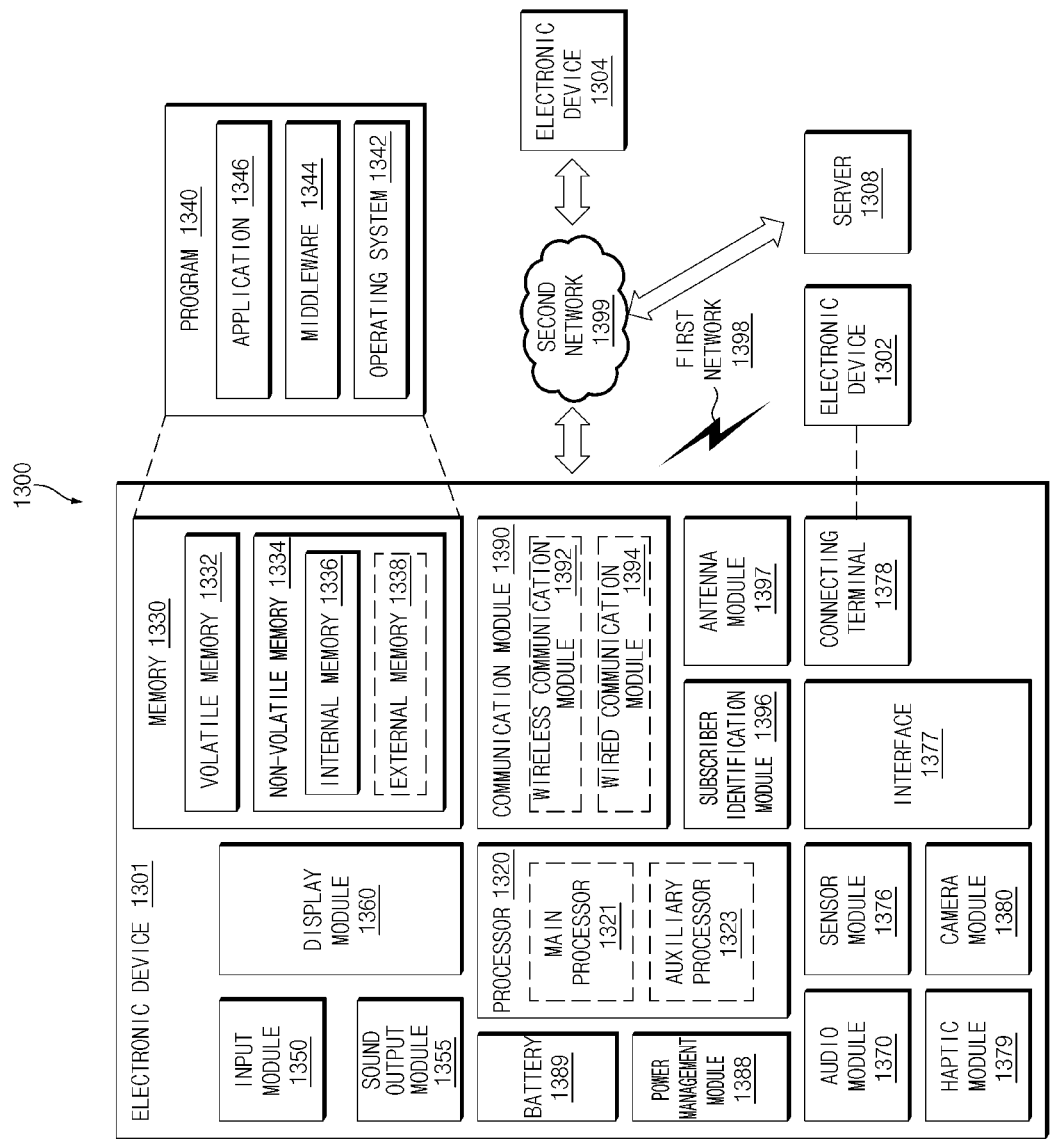
FIG. 13 illustrates an electronic device in a network environment according to an embodiment of the disclosure.

In an embodiment, the display 101 may include an area, in which the first camera module 105 (e.g., a camera module 1380 of FIG. 13). In an embodiment, an opening part may be formed in the area of the display 101, and the first camera module 105 (e.g., a punch hole camera) may be at least partially disposed in the opening part to face the first surface 100A. In this case, the screen display area 101A may surround at least a portion of a periphery of the opening part. In another embodiment, the first camera module 105 (e.g., an under display camera (UCD)) may be disposed under the display 101 to overlap the area of the display 101. In this case, the display 101 may provide visual information to the user through the area, and additionally, the first camera module 105 may acquire an image corresponding to a direction that faces the first surface 100A through the area of the display 101.

In an embodiment, the display 101 may be coupled to or be disposed to be adjacent to a touch detection circuit, a pressure sensor that may measure the strength (the pressure) of a touch, and/or a digitizer that detects a stylus pen of a magnetic field type.

According to an embodiment, the audio modules 103, 104, and 107 (e.g., an audio module 1370 of FIG. 13) may include microphone holes 103 and 104 and a speaker hole 107.

In an embodiment, the microphone holes 103 and 104 may include the first microphone hole 103 formed in a partial area of the third surface 100C, and the second microphone hole 104 formed in a partial area of the second surface 100B. Microphones (not illustrated) for acquiring external sounds may be disposed in interiors of the microphone holes 103 and 104. The microphones may include a plurality of microphones to sense a direction of sound.

In an embodiment, the second microphone hole 104 formed in a partial area of the second surface 100B may be disposed to be adjacent to the camera modules 105, 112, and 113. For example, the second microphone hole 104 may acquire sounds according to operations of the camera modules 105, 112, and 113. However, the disclosure is not limited thereto.

In an embodiment, the speaker hole 107 may include the external speaker hole 107 and a communication receiver hole (not illustrated). The external speaker hole 107 may be formed at a portion of the third surface 100C of the electronic device 100. In another embodiment, the external speaker hole 107 and the microphone hole 103 may be implemented with one hole. Although not illustrated, the communication receiver hole (not illustrated) may be formed at another portion of the third surface 100C. For example, a receiver hole for communication may be formed on the third surface 100C on an opposite side to the external speaker hole 107. For example, with respect to the illustration of FIG. 1, the external speaker hole 107 may be formed on the third surface 100C corresponding to a lower end of the electronic device 100, and the receiver hole for communication may be formed on the third surface 100C corresponding to an upper end of the electronic device 100. However, the disclosure is not limited thereto, and in another embodiment, the receiver hole for communication may be formed at a location other than the third surface 100C. For example, the receiver hole for communication may be defined by a spacing space between the front plate 102 (or the display 101) and the side bezel structure 118.

In an embodiment, the electronic device 100 may include at least one speaker (not illustrated) that outputs sounds to an outside of the housing through the external speaker hole 107 and/or the receiver hole for communication (not illustrated).

In an embodiment, the sensor module (not illustrated) (e.g., a sensor module 1376 of FIG. 13) may generate an electrical signal or a data value corresponding to an operation state of the interior of the electronic device 100 or an environmental state of the outside. For example, the sensor module may include at least one of a proximity sensor, a heart rate monitor (HRM) sensor, a fingerprint sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illumination sensor.

In an embodiment, the camera modules 105, 112, and 113 (e.g., the camera module 1380 of FIG. 13) may include the first camera module 105 disposed to face the first surface 100A of the electronic device 100, the second camera module 112 and the flash 113 disposed to face the second surface 100B.

In an embodiment, the second camera module 112 may include a plurality of cameras (e.g., a dual camera, a triple camera, or a quad camera). However, the second camera module 112 is not limited to necessarily include a plurality of cameras, and may include one camera.

In an embodiment, the first camera modules 105 and the second camera module 112 may include one or a plurality of lenses, an image sensor, and/or an image signal processor.

In an embodiment, the flash 113, for example, may include a light emitting diode or a xenon lamp. In another embodiment, two or more lenses (an infrared ray camera, and a wide angle/telephoto lens), and image sensors may be disposed on one surface of the electronic device 100.

In an embodiment, the key input device 117 (e.g., an input module 1350 of FIG. 13) may be disposed on the third surface 100C of the electronic device 100. In another embodiment, the electronic device 100 may not include some or all of the above-mentioned key input devices 117 and the key input devices 117, which are not included, may be realized in different forms, such as a soft key, on the display 101.

In an embodiment, the connector hole 108 may be formed on the third surface 100C of the electronic device 100 to accommodate a connector of an external device. A connection terminal (e.g., a connection terminal 1378 of FIG. 13) electrically connected to the connector of the external device may be disposed in the connector hole 108. The electronic device 100 according to an embodiment may include an interface module (e.g., an interface 1377 of FIG. 13) for processing an electrical signal transmitted and received through the connection terminal.

In an embodiment, the electronic device 100 may include a light emitting element (not illustrated). For example, the light emitting element (not illustrated) may be disposed on the first surface 100A of the housing. The light emitting element (not illustrated) may provide state information on the electronic device 100 in the form of light. In another embodiment, the light emitting element (not illustrated) may provide a light source that interworks with an operation of the camera module 105. For example, the light emitting element (not illustrated) may include a light emitting diode (LED), an IR LED, and/or a xenon lamp.

Figure 2:
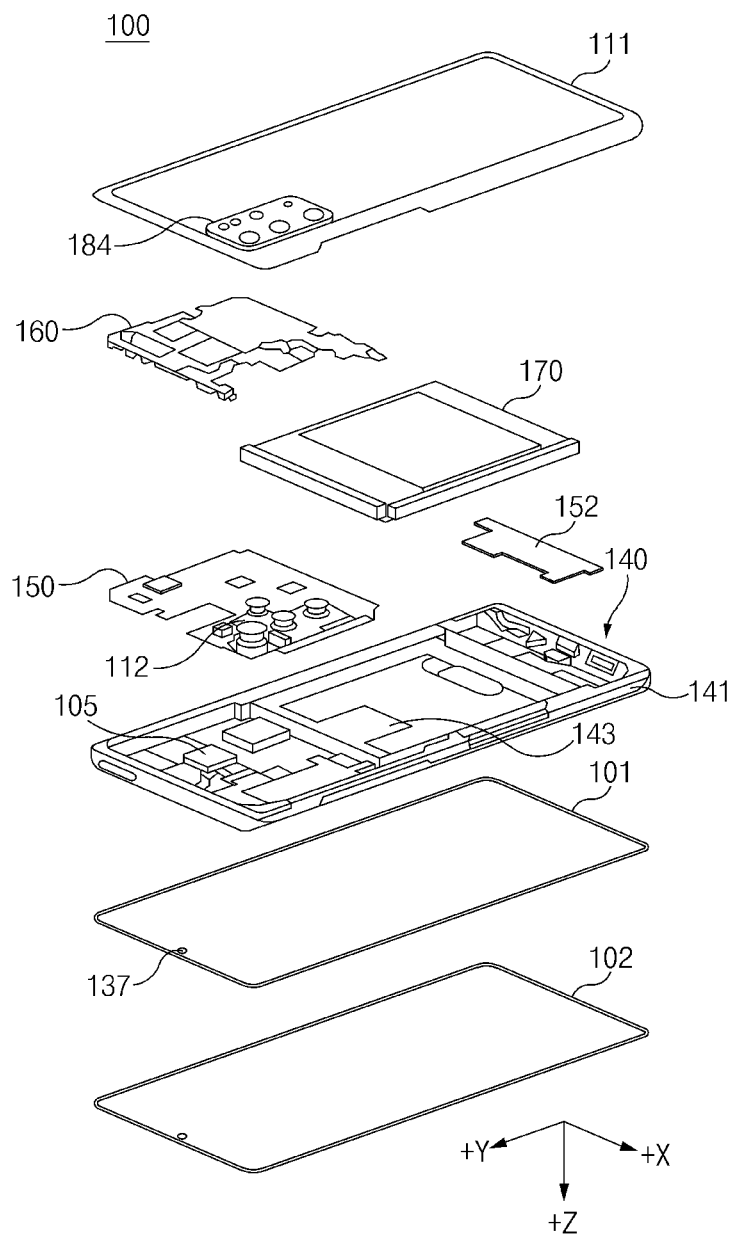
FIG. 2 is an exploded perspective view of an electronic device according to an embodiment of the disclosure.

FIG. 2 is an exploded perspective view of an electronic device according to an embodiment of the disclosure.

Hereinafter, a repeated description of configurations having the same reference numerals as the above-described configurations will be omitted.

Referring to FIG. 2, the electronic device 100 according to an embodiment may include the frame structure 140, a first printed circuit board 150, a second printed circuit board 152, a cover plate 160, and a battery 170.

In an embodiment, the frame structure 140 may include the side wall 141 that defines an external appearance (e.g., the third surface 100C of FIG. 1) of the electronic device 100, and a support part 143 that extends inwards from the side wall 141. In an embodiment, the frame structure 140 may be disposed between the display 101 and the rear plate 111. In an embodiment, the side wall 141 of the frame structure 140 may surround a space between the rear plate 111 and the front plate 102 (and/or the display 101), and the support part 143 of the frame structure 140 may extend from the side wall 141 in the space.

In an embodiment, the frame structure 140 may support or accommodate other elements included in the electronic device 100. For example, the display 101 may be disposed on one surface (e.g., an one surface 143a of FIG. 3A) of the frame structure 140, which faces one direction (e.g., the +z axis direction), and the display 101 may be supported by the support part 143 of the frame structure 140. As another example, the first printed circuit board 150, the second printed circuit board 152, the battery 170, and the second camera module 112 may be disposed on an opposite surface (e.g., an opposite surface 143b of FIG. 3B) that faces an opposite direction (e.g., the −z axis direction) to the one surface. The first printed circuit board 150, the second printed circuit board 152, the battery 170, and the second camera module 112 may be seated in a recess defined by the side wall 141 and/or the support part 143 of the frame structure 140.

In an embodiment, the first printed circuit board 150, the second printed circuit board 152, and the battery 170 may be coupled to the frame structure 140. For example, the first printed circuit board 150 and the second printed circuit board 152 may be fixedly disposed in the frame structure 140, through a coupling member, such as a screw. For example, the battery 170 may be fixedly disposed in the frame structure 140, through an adhesion member (e.g., a double-sided tape). However, the disclosure is not limited by the above-described example.

In an embodiment, the cover plate 160 may be disposed between the first printed circuit board 150 and the rear plate 111. In an embodiment, the cover plate 160 may be disposed on the first printed circuit board 150. For example, the cover plate 160 may be disposed on a surface of the first printed circuit board 150, which faces the −z axis direction.

In an embodiment, the cover plate 160 may at least partially overlap the first printed circuit board 150 with respect to the z axis. In an embodiment, the cover plate 160 may cover at least a partial area of the first printed circuit board 150. Through this, the cover plate 160 may protect the first printed circuit board 150 from a physical impact, or may prevent or alleviate deviation of the connector coupled to the first printed circuit board 150.

In an embodiment, the cover plate 160 may be fixedly disposed in the first printed circuit board 150 through a coupling member (e.g., a screw), or may be coupled to the frame structure 140 together with the first printed circuit board 150 through the coupling member.

In an embodiment, the display 101 may be disposed between the frame structure 140 and the front plate 102. For example, the front plate 102 may be disposed on one side (e.g., the +z axis direction) of the display 101, and the frame structure 140 may be disposed on an opposite side (e.g., the −z axis direction).

In an embodiment, the front plate 102 may be coupled to the display 101. For example, the front plate 102 and the display 101 may be bonded to each other through an adhesion member for optics (e.g., an optically clear adhesive (OCA) or an optically clear resin (OCR)) interposed therebetween.

In an embodiment, the front plate 102 may be coupled to the frame structure 140. For example, the front plate 102 may include an outskirt part that extends to an outside of the display 101 when viewed in the z axis direction, and may be bonded to the frame structure 140 through an adhesion member (e.g., a double-sided tape) disposed between the outskirt part of the front plate 102 and the frame structure 140 (e.g., the side wall 141). However, the disclosure is not limited by the above-described example.

In an embodiment, a processor (e.g., a processor 1320 of FIG. 13), a memory (e.g., a memory 1330 of FIG. 13), and/or an interface (e.g., an interface 1377 of FIG. 13) may be mounted in the first printed circuit board 150 and/or the second printed circuit board 152. The processor, for example, may include one or more central processing units, an application processor, a graphic processing unit, an image signal processor, a sensor hub processor, or a communication processor. The memory, for example, may include a volatile and/or nonvolatile memory. The interface, for example, may include a high definition multimedia interface (HDMI), a universal serial bus (USB), a secure digital (SD) card interface, and/or an audio interface. The interface, for example, may electrically or physically connect the electronic device 100 to an external electronic device, and may include a USB connector, an SD card/multimedia card (MMC) connector, and an audio connector. In an embodiment, the first printed circuit board 150 and the second printed circuit board 152 may be operatively or electrically connected to each other through a connection member (e.g., a flexible printed circuit board).

In an embodiment, the battery (e.g., a battery 1389 of FIG. 13) may supply electric power to at least one element of the electronic device 100. For example, the battery 170 may include a rechargeable secondary battery or a fuel cell. At least a portion of the battery 170 may be disposed on substantially the same plane as the first printed circuit board 150 and/or the second printed circuit board 152.

The electronic device 100 according to an embodiment may include an antenna module (not illustrated) (e.g., an antenna module 1397 of FIG. 13). According to an embodiment, the antenna module may be disposed between the rear plate 111 and the battery 170. The antenna module, for example, may include a near field communication (NFC) antenna, a wireless charging antenna, and/or a magnetic secure transmission (MST) antenna. The antenna module, for example, may perform short-range communication with an external device, or may wirelessly transmit and receive electric power to and from the external device.

In an embodiment, the first camera module 105 (e.g., the front camera) may be disposed at least a portion (e.g., the support part 143) of the frame structure 140 such that the lens receives external light through a partial area (e.g., a camera area 137) of the front plate 102 (e.g., the first surface 100A of FIG. 1).

In an embodiment, the second camera module 112 (e.g., the rear camera) may be disposed between the frame structure 140 and the rear plate 111. In an embodiment, the second camera module 112 may be electrically connected to the first printed circuit board 150 through a connection member (e.g., a connector). In an embodiment, the second camera module 112 may be disposed such that the lens receives external light through a camera area 184 of the rear plate 111 of the electronic device 100.

In an embodiment, the camera area 184 may be formed on a surface (e.g., the second surface 100B of FIG. 1) of the rear plate 111. In an embodiment, the camera area 184 may be formed to be at least transparent such that external light is input to the lens of the second camera module 112. In an embodiment, at least a portion of the camera area 184 may protrude from the surface of the rear plate 111 by a specific height. However, this is not limited thereto, and in another embodiment, the camera area 184 may define a plane that is substantially the same as the surface of the rear plate 111.

In an embodiment, the housing of the electronic device 100 may refer to a configuration or a structure that defines at least a portion of an external appearance of the electronic device 100. In this regard, at least some of the front plate 102, the frame structure 140, and/or the rear plate 111 that define the external appearance of the electronic device 100 may be referenced as the housing of the electronic device 100.

FIG. 3A is a first perspective view of a frame structure according to an embodiment of the disclosure.

Figure 3B:
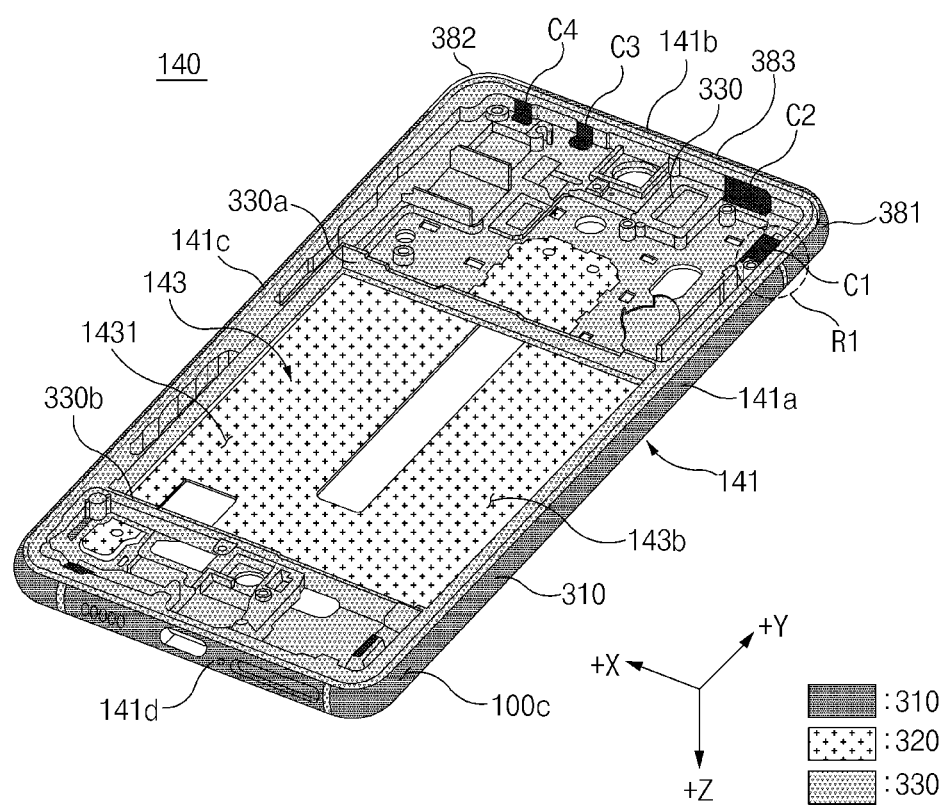
FIG. 3B is a second perspective view of a frame structure according to an embodiment of the disclosure.

FIG. 3B is a second perspective view of a frame structure according to an embodiment of the disclosure.

Figure 3C:
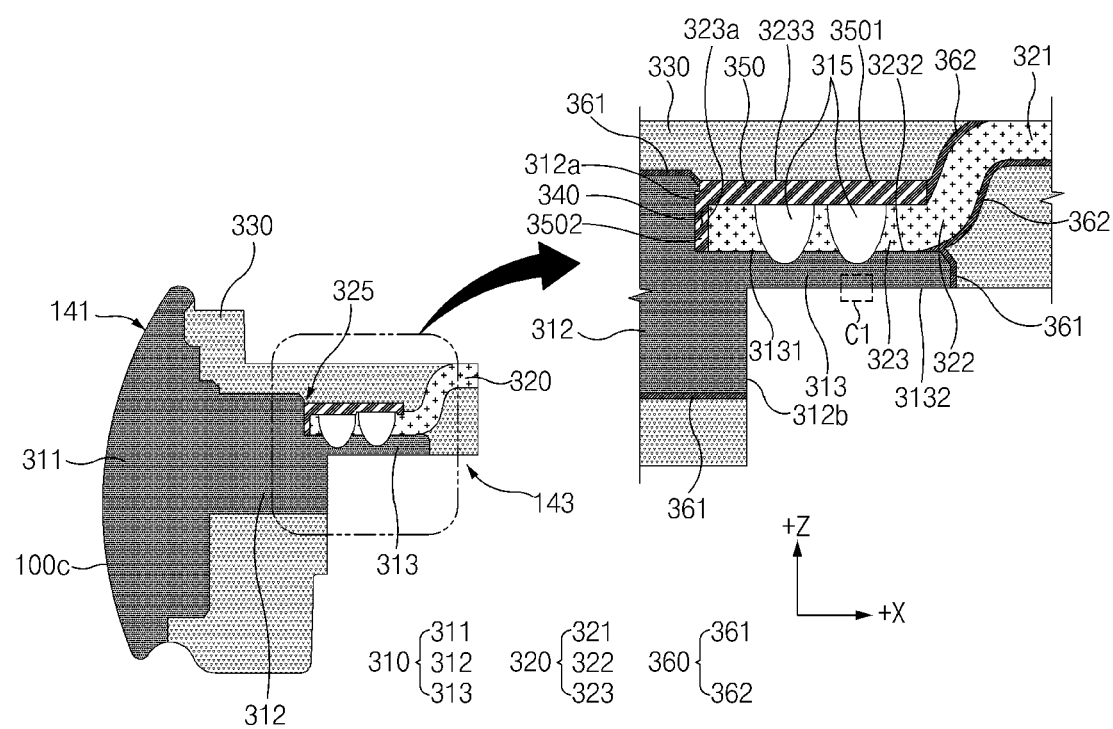
FIG. 3C is a cross-sectional view corresponding to area R1 of FIGS. 3A and 3B according to an embodiment of the disclosure.

FIG. 3C is a cross-sectional view corresponding to an area R1 of FIGS. 3A and 3B according to an embodiment of the disclosure. FIG. 3C may be a cross-sectional view obtained by cutting the area R1 of the frame structure by an x-z plane according to an embodiment of the disclosure.

Referring to FIGS. 3A and 3B, the frame structure 140 according to an embodiment may include a first conductive member (or a first conductive part) 310, a second conductive member (or a second conductive part) 320, and a nonconductive member (or a nonconductive part) 330. In an embodiment, the first conductive member 310 and the second conductive member 320 may include an electrically conductive material, for example, a conductive metal or alloy. For example, the first conductive member 310 and/or the second conductive member 320 may include aluminum, an aluminum alloy, stainless steel, titanium, a titanium alloy, magnesium, a magnesium alloy, copper, a copper alloy, or a combination thereof, but the disclosure is not limited by the above-described example. In an embodiment, the first conductive member 310 and the second conductive member 320 may include the same or different materials. In an embodiment, the nonconductive member 330 may include an electrically nonconductive material, for example, a resin.

In an embodiment, the side wall 141 of the frame structure 140 may include a first side wall 141a that extends in a lengthwise direction (e.g., the y axis direction) of the electronic device 100, a second side wall 141b that extends from the first side wall 141a in a widthwise direction, a third side all 141c that extends from the second side wall 141b to face the first side wall 141a, and a fourth side wall 141d that extends from the third side wall 141c to the first side wall 141a to face the second side wall 141b. In an embodiment, the first side wall 141a and the third side wall 141c may extend substantially in parallel to each other, but the disclosure is not limited thereto. In an embodiment, the second side wall 141b and the fourth side wall 141d may extend substantially in parallel to each other, but the disclosure is not limited thereto. In an embodiment, the first side wall 141a and the third side wall 141c may have lengths that are larger than those of the second side wall 141b and the fourth side wall 141d, but the disclosure is not limited thereto. In an embodiment, it is illustrated that a shape of the electronic device 100 has a rectangular bar-type shape, a length of which is larger than a width thereof, but the disclosure is not limited by the illustrated example.

In an embodiment, the side wall 141 of the frame structure 140 may be defined by the first conductive member 310 and the nonconductive member 330. In an embodiment, the nonconductive member 330 corresponding to the side wall 141 may define the third surface 100C of the electronic device 100 together with the first conductive member 310. In an embodiment, it may be understood that the side wall 141 of the frame structure 140 is defined by the first conductive member 310, the second conductive member 320, and the nonconductive member 330, but the second conductive member 320 may not be exposed through the third surface 100C of the electronic device 100.

In an embodiment, the first conductive member 310 may include a plurality of segments. The plurality of segments may be at least partially separated from adjacent segments. In an embodiment, a spacing space may be formed as the plurality of segments are at least partially separated. In an embodiment, the nonconductive member 330 may be at least partially disposed in the spacing spaces defined between the adjacent segments. For example, the first conductive member 310 may include a first segment 381, and a second segment 382 that is adjacent to the first segment 381. The first segment 381 and the second segment 382 may be at least partially spaced apart from each other, and a spacing space 383 may be formed between the first segment 381 and the second segment 382. The nonconductive member 330 corresponding to the side wall 141 (or the second side wall 141b) may be at least partially filled in the spacing space 383.

In an embodiment, it may be understood that the second conductive member 320 is connected to some of the plurality of segments of the first conductive member 310 to form the plurality of segments together with the first conductive member 310. For example, the second conductive member 320 may be electrically connected to at least some of the plurality of segments of the first conductive member 310.

In an embodiment, contact parts (or contact points) may be provided in at least some of the plurality of segments. For example, a first contact part C1 and a second contact part C2 may be formed in the first segment 381. A third contact part C3 and a fourth contact part C4 may be formed in the second segment 382.

In an embodiment, through the contact parts, at least some of the plurality of segments may be electrically connected to a wireless communication circuit (e.g., a wireless communication module 1392 of FIG. 13) disposed in a printed circuit board (e.g., the first printed circuit board 150 of FIG. 2), and/or a ground part (e.g., a ground plane provided in the printed circuit board) of the electronic device 100. At least some of the plurality of segments may be operated as antenna radiators (or antenna elements) for receiving electric power from the wireless communication circuit and transmitting and receiving a wireless signal of a specific band. For example, the first segment 381 may be electrically connected to a ground plane provided in the printed circuit board through the first contact part C1, and may be electrically connected to the wireless communication circuit through the second contact part C2. For example, the second segment 382 may be electrically to the wireless communication circuit through the third contact part C3, and may be electrically connected to the ground plane of the printed circuit board through the fourth contact part C4. In an embodiment, the first segment 381 and the second segment 382 may be operated as antenna radiators for transmitting and receiving a wireless signal of a specific band. However, electrical connection relationships through the contact parts of the first segment 381 and/or the second segment 382 are not limited to the above-described example. For example, antenna structures of various types may be applied to the first segment 381 and/or the second segment 382 of the first conductive member 310, and thus at least one or more of the first to fourth contact parts C1 to C4 may be omitted or a contact part that is not illustrated may be further included.

In an embodiment, the first conductive member 310 may be electrically connected to the second conductive member 320. For example, the first segment 381 and/or the second segment 382 of the first conductive member 310 may be electrically connected to the second conductive member 320. In this case, the first conductive member 310 may at least partially form the antenna structure of the electronic device 100 together with the second conductive member 320. For example, the first conductive member 310 may at least partially form the antenna radiator of the electronic device 100 together with the second conductive member 320.

In an embodiment, various connection members, for example, a C-clip or a coaxial cable may be used to electrically connect the first segment 381 and the second segment 382 to the contact parts, but the disclosure is not limited to the above-described example.

In an embodiment, the first segment 381 may include a portion of the first side wall 141a, and a first part of the second side wall 141b, which extends from the portion of the first side wall 141a. The nonconductive members 330 may be disposed at opposite ends of the first segment 381. The second segment 382 may include a second part of the second side wall 141b, which is at least partially separated from the first segment 381 while the nonconductive member 330 disposed in the spacing space 383 being interposed therebetween, and a portion of the third side wall 141c that extends from the second part. The nonconductive members 330 may be at least partially disposed at opposite ends of the second segment 382. Physical features (e.g., a length, a thickness, and a shape) of the first segment 381 and/or the second segment 382 that forms the antenna structure are not limited to the illustrated embodiment. For example, various design changes that may be applied by an ordinary person in the art may be made to the first segment 381 and/or the second segment 382 according to characteristics (e.g., a frequency, a bandwidth, and the like) of a wireless signal that is to be transmitted or received by using them.

In an embodiment, the support part 143 of the frame structure 140 may extend from the side wall 141 to an inside of the electronic device 100. In an embodiment, the support part 143 may be defined by the second conductive member 320 and the nonconductive member 330. In another embodiment, the support part 143 may be defined by the first conductive member 310, the second conductive member 320, and the nonconductive member 330.

In an embodiment, the support part 143 may be configured to support various elements of the electronic device 100. For example, referring to FIG. 3A, the one surface 143a of the support part 143 may be at least partially formed to be substantially flat, and may support the display (e.g., the display 101 of FIG. 1) disposed thereon. The one surface 143a of the support part 143 may be defined by the second conductive member 320 and the nonconductive member 330.

In an embodiment, the support part 143 may be configured to accommodate various elements of the electronic device 100. For example, referring to FIG. 3B, the support part 143 may include a plurality of partition walls that define a recess for accommodating various elements of the electronic device 100. For example, the support part 143 of the frame structure 140 may further include the opposite surface 143b that is formed to be substantially flat. The opposite surface 143b may be an opposite surface to the one surface 143a of the support part 143. The support part 143 of the frame structure 140 may include a first partition wall 330a and a second partition wall 330b that extend from the opposite surface 143b in a height direction (e.g., the −z axis direction). In an embodiment, a partial area of the opposite surface 143b of the support part 143, the first partition wall 330a, and the second partition wall 330b may define a recess 1431, together with the first side wall 141a and the third side wall 141c. A battery (e.g., the battery 170 of FIG. 2), for example, may be accommodated in the recess 1431. In an embodiment, the first partition wall 330a and the second partition wall 330b may be defined by the nonconductive member 330. In an embodiment, the opposite surface 143b may be defined by the second conductive member 320.

Referring to FIG. 3C, the first conductive member 310 of the frame structure 140 may include an outer part 311, and a coupling part 312 that extends from the outer part 311.

In an embodiment, the outer part 311 of the first conductive member 310 may define the third surface 100C of the electronic device 100. In an embodiment, the coupling part 312 of the first conductive member 310 may extend from the outer part 311 in an inward direction of the electronic device 100. As another example, the coupling part 312 may extend from the outer part 311 toward the second conductive member 320. As another example, the coupling part 312 may extend from the outer part 311 toward a side wall located on an opposite side. For example, the coupling part 312 may extend from the outer part 311 corresponding to the first side wall 141a toward the third side wall 141c located on an opposite side.

In an embodiment, the coupling part 312 may include a protruding part 313 that extends to at least partially face the second conductive member 320. In an embodiment, the protruding part 313 may extend between a first side surface 312a and a second side surface 312b of the coupling part 312, in a direction (e.g., the x axis direction) that becomes farther away from the outer part 311. In an embodiment, the protruding part 313 may at least partially overlap the second conductive member 320.

In an embodiment, the protruding part 313 may have a first thickness. In an embodiment, the coupling part 312 may have a second thickness. In an embodiment, the outer part 311 may have a third thickness. For example, the second thickness of the coupling part 312 may be larger than the first thickness of the protruding part 313. For example, the third thickness of the outer part 311 may be larger than the first thickness of the protruding part 313. However, the disclosure is not limited by the above-described example. The first thickness, the second thickness, and the third thickness may mean lengths of the protruding part 313, the coupling part 312, and the outer part 311 with respect to the z axis of FIG. 3C.

In an embodiment, the second conductive member 320 may include an inner part 321, a connecting part 322, and an end part 323. In an embodiment, the inner part 321 may be formed to be substantially flat. For example, as in the description made with reference to FIG. 3A, the inner part 321 may at least partially define the one surface of the second conductive member 320 that is formed to be substantially flat to support the display. For example, the inner part 321 may have an at least partially plate-like shape. In an embodiment, the connecting part 322 may extend from a periphery of the inner part 321 to the end part 323 toward the first conductive member 310. In an embodiment, the connecting part 322 may include a curved portion. For example, the connecting part 322 may extend from the inner part 321 to a height that is different from that of the inner part 321. The height may mean a location with respect to the z axis of FIG. 3C. In another embodiment, the second conductive member 320 may not include the connecting part 322, or the connecting part 322 may not include a curved portion (or a portion that extends at an inclination that is different from that of the inner part 321). In this case, the inner part 321 and the end part 323 of the second conductive member 320 may be located at substantially the same height.

In an embodiment, the end part 323 of the second conductive member 320 may extend from the connecting part 322 toward the coupling part 312 (or the outer part 311) of the first conductive member 310. In an embodiment, the end part 323 of the second conductive member 320 may be located at a height that is different from the inner part 321. For example, the end part 323 of the second conductive member 320 may be located on a lower side (e.g., the −z axis direction) of the inner part 321, with respect to the illustration of FIG. 3C. However, the disclosure is not limited thereto, and the end part 323 of the second conductive member 320 may be located at substantially the same height as that of the inner part 321.

In an embodiment, the end part 323 of the second conductive member 320 may be seated on a stepped part 325 (or a seating part) defined by the first side surface 312a of the coupling part 312 and a first surface 3131 (or a first surface 3131 of the protruding part 313).

In an embodiment, the end part 323 of the second conductive member 320 may at least partially overlap the protruding part 313 of the first conductive member 310. In an embodiment, the end part 323 of the second conductive member 320 may extend substantially in parallel to the protruding part 313 of the first conductive member 310, but the disclosure is not limited thereto.

In an embodiment, the end part 323 of the second conductive member 320 may at least partially contact the protruding part 313 of the first conductive member 310. In an embodiment, the protruding part 313 may include the first surface 3131 that extends from a periphery of the first side surface 312a of the coupling part 312. In an embodiment, the end part 323 of the second conductive member 320 may include a second surface 3232 that faces the protruding part 313. In an embodiment, the first surface 3131 of the protruding part 313 and the second surface 3232 of the end part 323 may at least partially contact each other.

In an embodiment, the end part 323 of the second conductive member 320 may be partially spaced apart from the first conductive member 310. For example, the end part 323 of the second conductive member 320 may be spaced apart from the coupling part 312 of the first conductive member 310. For example, the end part 323 of the second conductive member 320 may be spaced apart from the first side surface 312a of the coupling part 312 while being seated on the stepped part 325 of the coupling part 312. In an embodiment, the end part 323 of the second conductive member 320 may be spaced apart from the coupling part 312 of the first conductive member 310 to form a first gap 340. The first gap 340 may a space, in which a tolerance of a process of coupling (or assembling) the first conductive member 310 and the second conductive member 320 is considered.

In an embodiment, the first gap 340 may be defined by a partial area of the first surface 3131 of the protruding part 313, which does not contact the second conductive member 320, the first side surface 312a of the coupling part 312, and a surface 323a of the end part 323. The surface 323a of the end part 323 may extend from a periphery of the second surface 3232 to a periphery of a third surface 3233. In an embodiment, the first side surface 312a of the coupling part 312 and the first surface 3131 of the protruding part 313 may extend at different inclinations to define the stepped part 325. For example, the first surface 3131 of the protruding part 313 may extend in a first direction (e.g., the x axis direction), and the first side surface 312a of the coupling part 312 may extend from a periphery (e.g., a periphery in the −x axis direction) of the first surface 3131 in a second direction (e.g., the +z axis direction) that is different from the first direction. In an embodiment, the surface 323a of the end part 323 may extend from the second surface 3232 of the end part 323 at an inclination that is different from that of the second surface 3232. For example, the second surface 3232 of the end part 323 may extend in a third direction (e.g., the x axis direction), and the surface 323a of the end part 323 may extend from a periphery (e.g., a periphery in the −x axis direction) of the second surface 3232 in a fourth direction (e.g., the +z axis direction) that is different from the third direction. In an embodiment, the first direction, in which the first surface 3131 of the protruding part 313 extends, and the third direction, in which the second surface 3232 of the end part 323 extends, may be substantially the same direction, but the disclosure is not limited thereto. In an embodiment, the second direction, in which the first surface 3131 of the coupling part 312 extends, and the fourth direction, in which the second surface 3232 of the end part 323 extends, may be substantially the same direction, but the disclosure is not limited thereto. In an embodiment, the surface 323a of the end part 323 and the first side surface 312a of the coupling part 312 may at least partially face each other, and may be spaced apart from each other.

In an embodiment, the coupling part 312 of the first conductive member 310 and the end part 323 of the second conductive member 320 may be bonded to each other through a bonding part 315. For example, the bonding part 315 may be formed through a laser welding process (however, the disclosure is not limited thereto as will be described below).

In an embodiment, the first conductive member 310 and the second conductive member 320 may be coupled to each other, through the above-described coupling structure, and may be electrically connected to each other.

In an embodiment, the first conductive member 310 and/or the second conductive member 320 may be provided with an antenna contact part. For example, the first contact part C1 may be provided in the protruding part 313 of the first conductive member 310. For example, the first contact part C1 may be located on an opposite surface 3132 of the first surface 3131 of the protruding part 313, but the disclosure is not limited thereto. In another embodiment, the first contact part C1 may be located on the second side surface 312b of the coupling part 312, which is adjacent to the opposite surface 3132 of the protruding part 313. In an embodiment, the first conductive member 310 and the second conductive member 320 may be supplied with electric power in the first contact part C1 and may be operated as antenna radiators.

The electronic device 100 according to an embodiment may include a first conductive connection member 350 and a bonding layer 360.

In an embodiment, the first conductive connection member 350 may be configured to have an electrical conductivity. The first conductive connection member 350, for example, may include a conductive solution, a conductive deposition layer (or a metal deposition layer), or a conductive film.

In an embodiment, the first conductive connection member 350 may be disposed at a portion, at which the first conductive member 310 and the second conductive member 320 are coupled (or bonded) to each other. For example, the first conductive connection member 350 may be at least partially disposed in the stepped part 325 of the first conductive member 310, in which the end part 323 of the second conductive member 320 is seated. In an embodiment, the first conductive connection member 350 may electrically connect the first conductive member 310 and the second conductive member 320.

In an embodiment, the first conductive connection member 350 may be disposed to at least partially contact the first conductive member 310 and the second conductive member 320. For example, the first conductive connection member 350 may be disposed to at least partially contact the coupling part 312 and the protruding part 313 of the first conductive member 310, and the end part 323 of the second conductive member 320.

In an embodiment, the first conductive connection member 350 may include a first part 3501 and a second part 3502. In an embodiment, the first part 3501 of the first conductive connection member 350 may be at least partially disposed on the third surface 3233 that is an opposite surface to the second surface 3232 of the end part 323. The third surface 3233 of the end part 323 may extend from a periphery of the surface 323a of the end part 323 to the connecting part 322.

In an embodiment, the first part 3501 of the first conductive connection member 350 may extend to the first side surface 312a of the first conductive member 310. In an embodiment, the first part 3501 of the first conductive connection member 350 may contact the first conductive member 310 and the second conductive member 320, and may electrically connect them.

In an embodiment, the second part 3502 of the first conductive connection member 350 may extend from the first part 3501 to the protruding part 313 of the first conductive member 310. For example, the second part 3502 of the first conductive connection member 350 may be disposed along the surface 323a of the end part 323 to be at least partially disposed in the first gap 340. In an embodiment, the second part 3502 of the first conductive connection member 350 may contact the first side surface 312a of the coupling part 312 and the surface 323a of the end part 323 to electrically connect the first conductive member 310 and the second conductive member 320. In another embodiment, the first conductive connection member 350 may not include at least a portion of the second part 3502.

In an embodiment, a thickness of the first conductive connection member 350, for example, may be 1 mm or less, but the disclosure is not limited thereto.

In an embodiment, the bonding layer (or a technologies rise from iwate (TRI)) 360 may include a first layer 361 at least partially interposed between the first conductive member 310 and the nonconductive member 330, and a second layer 362 at least partially interposed between the second conductive member 320 and the nonconductive member 330. The first layer 361 and the second layer 362 of the bonding layer 360 is for the purpose of classifying only a location of the bonding layer 360, and not for the purpose of limiting other technical features.

In an embodiment, the bonding layer 360 is for the purpose of enhancing a bonding force between the first and second conductive members 310 and 320, and the nonconductive member 330, and may include an organic compound such as triazine thiol or a triazine thiol based derivative. The bonding layer 360, for example, may be formed through a technologies rise from iwate (TRI) system or method. For example, the technologies rise from iwate (TRI) system or method may be described as a system or a method for sticking a metal and a resin.

In an embodiment, the bonding layer 360 may not be disposed between the first conductive connection member 350 and the nonconductive member 330. Because the bonding layer 360 is disposed between the nonconductive member 330 and the first and second conductive members 310 and 320, a bonding quality with the nonconductive member 330 may not become problematic even though the bonding layer 360 is not disposed between the first conductive connection member 350 and the nonconductive member 330. However, the disclosure is not limited thereto, and in another embodiment, the bonding layer 360 may be disposed between the first conductive connection member 350 and the nonconductive member 330.

The coupling structure of the first conductive member 310 and the second conductive member 320, which has been described with reference to FIG. 3C may be referenced as "a first coupling structure". In an embodiment, in an aspect, in which the first conductive connection member 350 is at least partially disposed in the first coupling structure and enhances an electrical connection between the first conductive member 310 and the second conductive member 320, it may be understood that the first conductive connection member 350 is included in the first coupling structure or forms the first coupling structure together.

Figure 9A:
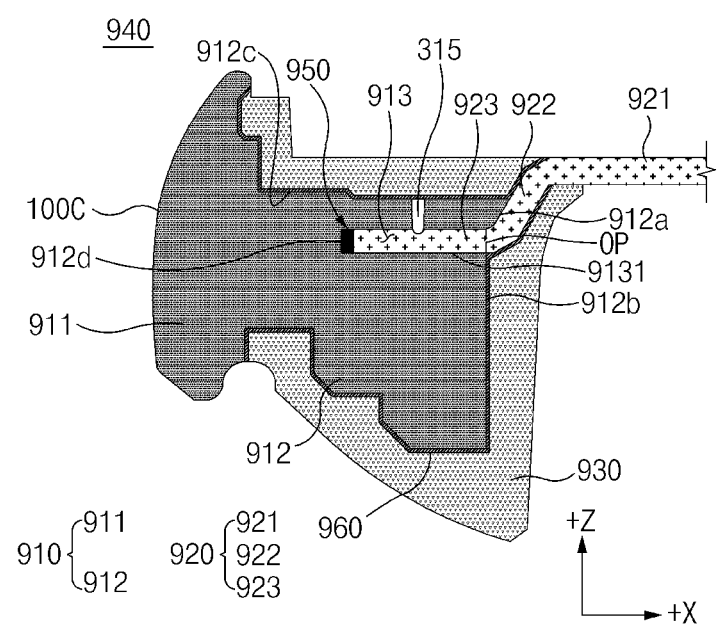
FIG. 9A is a cross-sectional view illustrating a frame structure according to an embodiment of the disclosure.

In an embodiment, the first coupling structure may be applied to a frame structure 940 illustrated in FIG. 9A. For example, the end part 323 of the first coupling structure may be applied to any one or more (e.g., the end part 323 of FIG. 9C) of a plurality of protrusions 420 illustrated in FIG. 9C. In this case, a first conductive member 910 may include the coupling part 312 and the protruding part 313, which correspond to the protrusion 420, to which the first coupling structure is applied. The stepped part 325 may be formed in the coupling part 312 and the protruding part 313. Similarly to the above-described one, the first coupling structure may be applied to a frame structure 1040 illustrated in FIG. 10A.

Hereinafter, a process of manufacturing the frame structure 140 will be described with reference to FIGS. 4, 5A, 5B, 5C, and 6, together with FIG. 3C.

Figure 4:
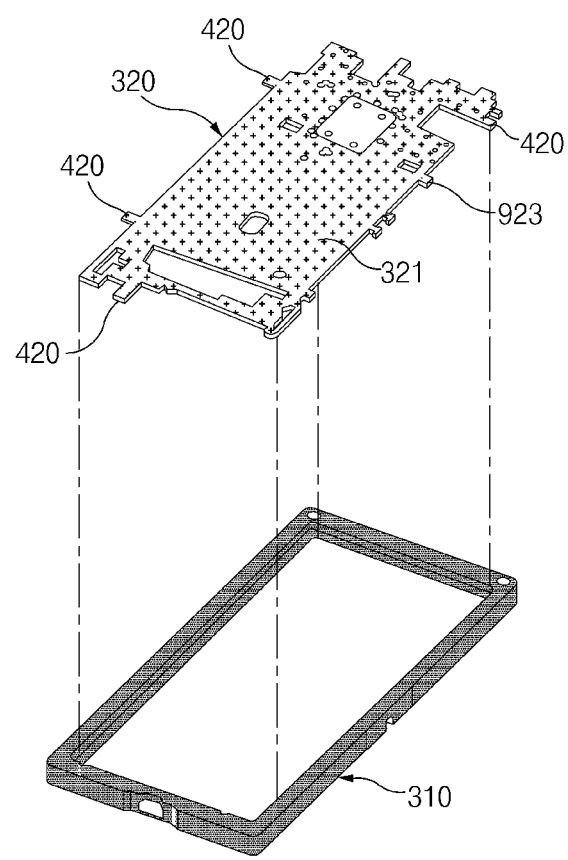
FIG. 4 is a view illustrating a process of assembling a first conductive member and a second conductive member according to an embodiment of the disclosure.

FIG. 4 is a view illustrating a process of assembling a first conductive member and a second conductive member according to an embodiment of the disclosure.

Referring to FIG. 4, in an embodiment, the first conductive member 310 and the second conductive member 320 may be provided.

In an embodiment, the first conductive member 310 may be manufactured through an extrusion process. Although FIG. 4 illustrates that the first conductive member 310 is integrally formed, but the disclosure is not limited thereto. For example, the first conductive member 310 may be formed in a scheme of coupling the plurality of separated configurations (e.g., a first member 910a and a second member 910b of FIG. 9C).

In an embodiment, the second conductive member 320 may be manufactured through rolling and pressing processes. In an embodiment, the second conductive member 320 may be pressed sheets formed through the rolling and pressing processes. In an embodiment, the second conductive member 320 may be thin plates manufactured through the rolling and pressing processes. For example, a thickness of the second conductive member 320 may be about 0.4 mm, but the disclosure is not limited thereto.

Referring to FIG. 4, the second conductive member 320 may include the plurality of protrusions 420 formed at a periphery of the inner part 321.

In an embodiment, at least some of the plurality of protrusions 420 may correspond to the connecting part 322 and the end part 323 of the second conductive member 320 of FIG. 3C. For example, the description of the connecting part 322 and the end part 323 provided with reference to FIG. 3C may be applied to the plurality of protrusions 420 in substantially the same, similar, or corresponding manner.

In an embodiment, the first conductive member 310 and the second conductive member 320 may be assembled with each other.

Figure 5A:
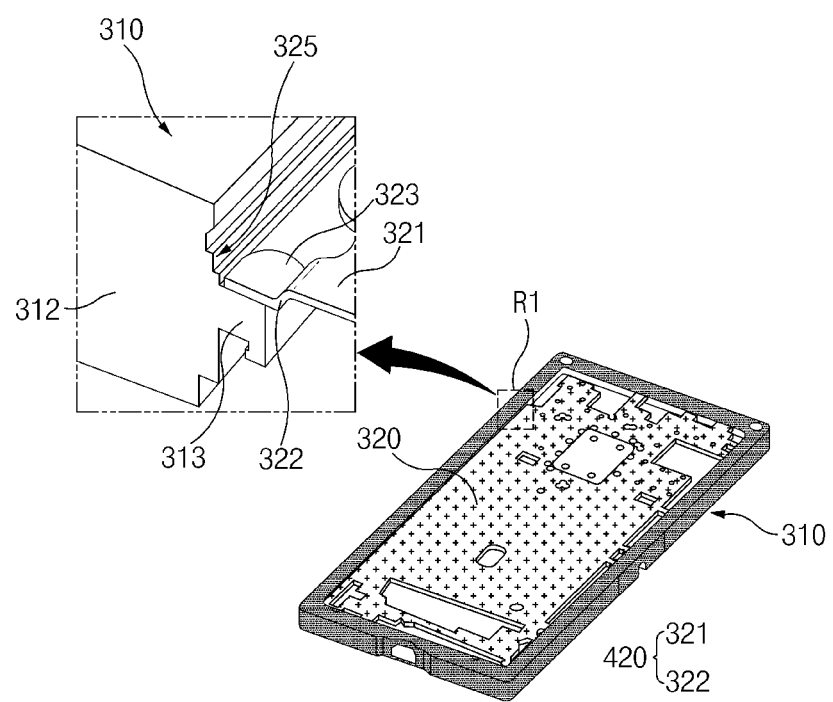
FIG. 5A is a view illustrating a state, in which a first conductive member and a second conductive member are assembled, according to an embodiment of the disclosure.

FIG. 5A is a view illustrating a state, in which a first conductive member and a second conductive member are assembled, according to an embodiment of the disclosure.

Figure 5B:
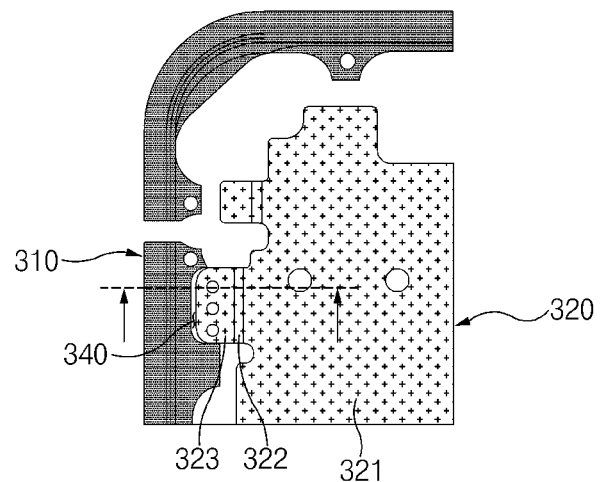
FIG. 5B is a view illustrating a plan view and a cross-sectional view of a frame structure corresponding to area R1 of FIG. 3A or FIG. 5A according to an embodiment of the disclosure.
Figure 5B:
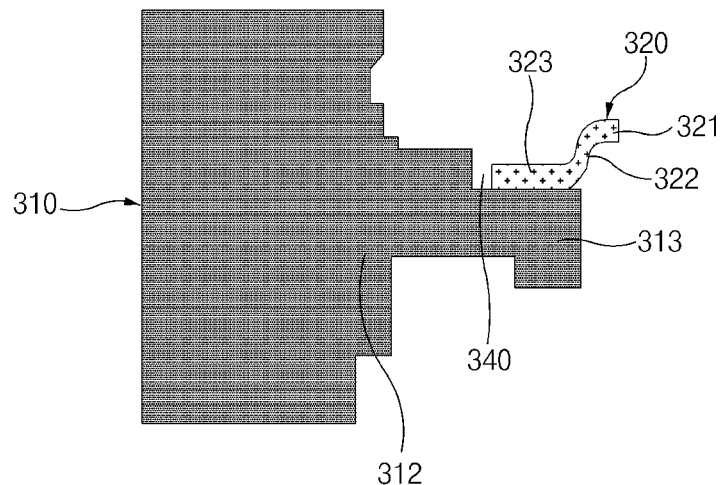

FIG. 5B is a view illustrating a plan view and a cross-sectional view of a frame structure corresponding to the area R1 of FIG. 3A or FIG. 5A according to an embodiment of the disclosure.

Referring to FIG. 5A, in an embodiment, the second conductive member 320 may be assembled with the first conductive member 310 in a form, in which the end part 323 thereof is seated on the stepped part 325 of the coupling part 312.

Referring to FIG. 5B, in an embodiment, the second conductive member 320 may be seated on the stepped part 325 in a form, in which the end part 323 thereof is spaced apart from the first conductive member 310 (e.g., the first side surface 312a of the first conductive member 310) while the first gap 340 being interposed therebetween.

Figure 5C:
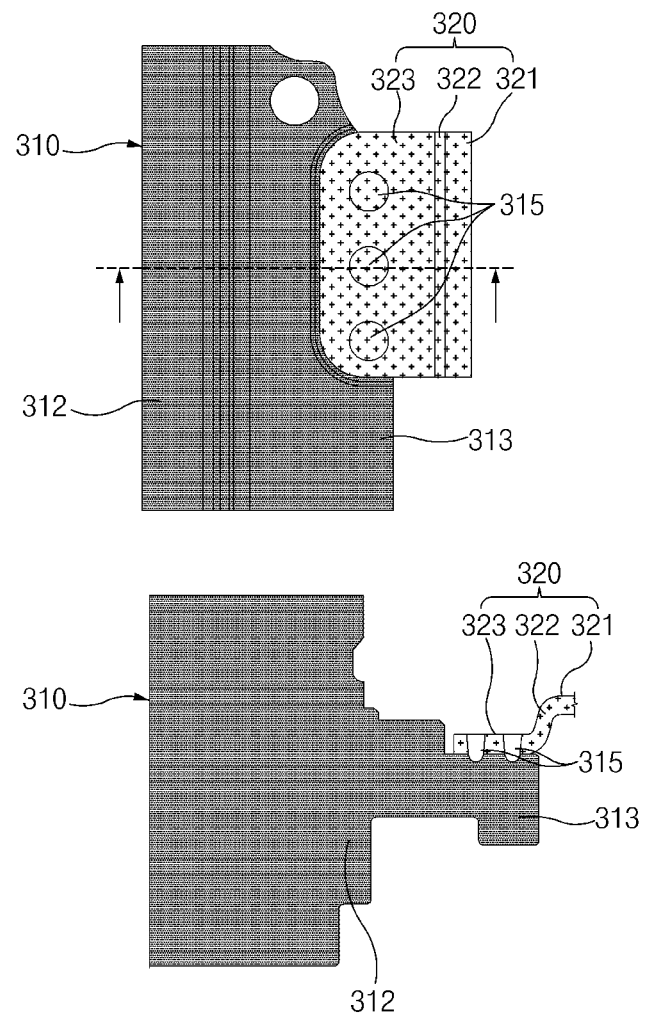
FIG. 5C is a view illustrating a process of coupling a first conductive member and a second conductive member according to an embodiment of the disclosure.

FIG. 5C is a view illustrating a process of coupling the first conductive member 310 and the second conductive member 320 according to an embodiment of the disclosure.

Referring to FIG. 5C, in an embodiment, the end part 323 of the second conductive member 320 and the protruding part 313 of the first conductive member 310 may be coupled to each other. For example, the end part 323 of the second conductive member 320 and the protruding part 313 of the first conductive member 310 may be bonded to each other through the bonding part 315. The bonding part 315, for example, may be formed through welding (e.g., laser welding). However, a method for mechanically and/or electrically connecting the end part 323 of the second conductive member 320 and the protruding part 313 of the first conductive member 310 is not limited to bonding through the above-described welding, and various methods that may be easily used by an ordinary person in the art may be applied. For example, the protruding part 313 of the first conductive member 310 and the end part 323 of the second conductive member 320 may be bonded to each other through a pressure welding or soldering process. As another example, unlike the illustration, the protruding part 313 of the first conductive member 310 and the end part 323 of the second conductive member 320 may be formed to be press-fitted with each other to be mechanically coupled to each other, and the first conductive member 310 and the second conductive member 320 that physically contact each other may be electrically connected to each other. In this case, to enhance an electrical conductivity between the first conductive member 310 and the second conductive member 320, a separate intermediate member (e.g., a conductive adhesive or conductive foam) may be disposed between the protruding part 313 and the end part 323, but the disclosure is not limited thereto. As another example, unlike the illustration, the protruding part 313 of the first conductive member 310 and the end part 323 of the second conductive member 320 may be formed to be mechanically coupled to each other through a separate coupling member (e.g., a screw), and the first conductive member 310 and the second conductive member 320 that physically contact each other may be electrically connected to each other. In this case, as described above, the intermediate member may be disposed between the first conductive member 310 and the second conductive member 320, but the disclosure is not limited thereto.

Figure 6:
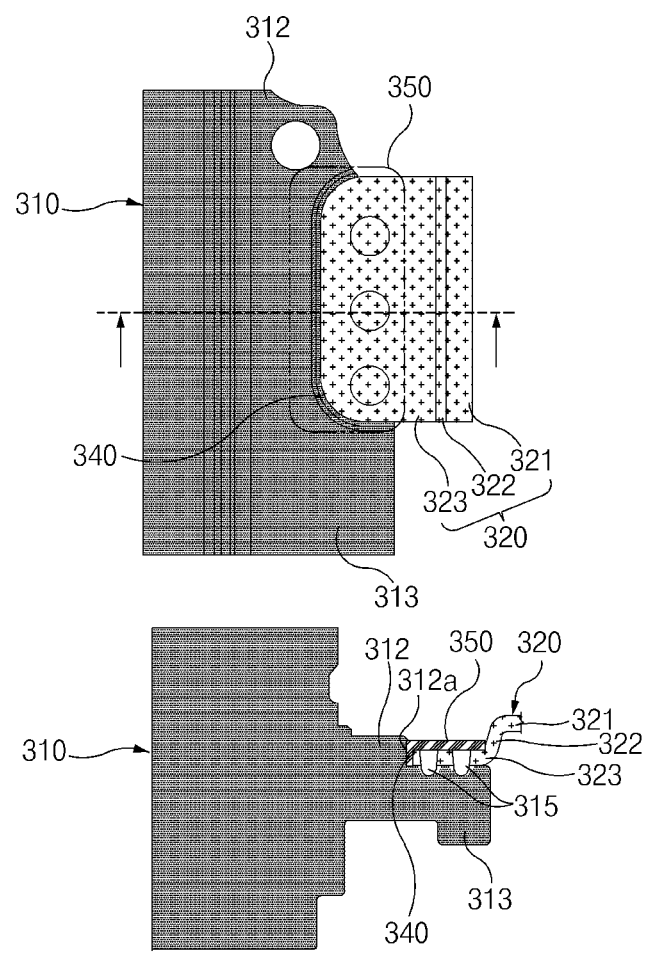
FIG. 6 is a view illustrating a process of forming a first conductive connection member of a frame structure according to an embodiment of the disclosure.

FIG. 6 is a view illustrating a process of forming a first conductive connection member of a frame structure according to an embodiment of the disclosure. FIG. 6 may be a plan view and a cross-sectional view corresponding to the area R1 of FIG. 3A or FIG. 5A.

Referring to FIG. 6, in an embodiment, the first conductive connection member 350 according to an embodiment may be disposed at a coupling part (or a bonding part) of the first conductive member 310 and the second conductive member 320. In an embodiment, the first conductive connection member 350 may be disposed to cover at least the end part 323 of the second conductive member 320. For example, as in the plan view illustrated in FIG. 6, the first conductive connection member 350 may be disposed on the coupling part 312 of the first conductive member 310 over the end part 323 of the second conductive member 320. As another example, as in the cross-sectional view illustrated in FIG. 6, the first conductive connection member 350 may be disposed on the end part 323 of the second conductive member 320 to the first side surface 312a of the coupling part 312. Additionally, the first conductive connection member 350 may be at least partially filled in the first gap 340.

In an embodiment, the first conductive connection member 350, for example, may include a conductive solution, a conductive deposition layer, or a conductive film.

The conductive solution, for example, may include a resin including conductive particles. For example, the conductive particles may include conductive metal particles formed of silver, copper, gold, aluminum, zinc, nickel, iron, or tin, but the disclosure is not limited by the above-described examples. The resin, for example, may include a thermosetting resin including epoxy or silicon or a thermosetting bonding resin, but the disclosure is not limited to the above-described example. In an embodiment, the first conductive connection member 350 may be formed by applying and curing the conductive solution. In an embodiment, when an injection-molding process is performed after the first conductive connection member 350 is applied, the conductive solution of the first conductive connection member 350 may include the thermosetting resin such that the first conductive connection member 350 is not damaged by heat applied in the injection-molding process. Additionally, an organic/inorganic pigment is applied to the conductive solution and thus a color of the first conductive connection member 350 may be implemented. Through this, it may be easily identified whether the application of the first conductive connection member 350 is omitted or an application quality satisfies a reference value.

The conductive deposition layer (or the conductive thin film), for example, may include one or a plurality of conductive layers formed through a deposition process using various conductive metals as a source. In this case, the first conductive connection member 350 may be formed through the above-described deposition process. Through a color of the source metal of the conductive deposition layer, a color of the first conductive connection member 350 may be implemented. Through this, it may be easily identified whether the application of the first conductive connection member 350 is omitted or a deposition quality satisfies a reference value.

In an embodiment, when the first conductive connection member 350 includes a conductive film, the first conductive connection member 350 may be formed by attaching the conductive film onto the first conductive member 310 and the second conductive member 320. In an embodiment, when the injection-molding process is performed after the conductive film is attached, the conductive film of the first conductive connection member 350 may include a thermosetting resin such that the conductive film is prevented from being damaged by the heat applied during the injection-molding process. Additionally, the conductive film may include a color printing layer. Through the color printing layer, a color may be implemented in the first conductive connection member 350. Through this, it may be easily identified whether the attachment of the first conductive connection member 350 is omitted or an attachment quality satisfies a reference value.

Referring to FIG. 3C, in an embodiment, the bonding layer 360 may be formed on surfaces of the first conductive member 310 and the second conductive member 320 which are coupled to each other. As described above, the bonding layer 360, for example, may be formed by applying an organic compound such as triazine thiol or a triazine thiol based derivative. An area, to which the bonding layer 360 is applied, may correspond to an area, in which the nonconductive member 330. As described above, in an embodiment, the bonding layer 360 may not be applied onto the first conductive connection member 350. In another embodiment, the bonding layer 360 may be applied onto the first conductive connection member 350, together with the first conductive member 310 and the second conductive member 320.

Thereafter, the nonconductive member 330 may be formed through an injection-molding process. The resin applied to the injection-molding process may include a thermoplastic material. For example, resins of various materials, such as polycarbonate, polybutylene terephthalate, polyethylene terephthalate, polyether aryl ketone, polyphenyline sulfone, polyphenyline sulfide, polyamide, and polyphthalamide. Additionally, various inorganic materials, such that glass fiber, carbon fiber, talc, whisker, wollastonite, glass powder, and zirconia-based ceramic material, may be added to the resin applied to the injection-molding process. However, the disclosure is not limited by the above-described example.

The nonconductive member 330 may surround at least the coupling part of the first conductive member 310 and the second conductive member 320 such that they are not exposed to an outside. Through this, a coupling force of the first conductive member 310, the second conductive member 320, and the first conductive connection member 350 may be enhanced, and the coupling part of the first conductive member 310 and the second conductive member 320, and the first conductive connection member 350 disposed herein may be protected from an external environment.

After the injection-molding process, a shape of the third surface 100C of the electronic device 100 may be formed through mechanical machining (e.g., computer numerical control (CNC) machining). For example, as illustrated in FIG. 3C, the third surface 100C of the electronic device 100 may be machined to have a curved surface. However, the shape of the third surface 100C formed through the mechanical machining is not limited to the illustrated example. In another embodiment, the third surface 100C of the electronic device 100 may at least partially include a substantially flat area.

After the shape of the third surface 100C of the electronic device 100 is formed, a surface-treating process (e.g., anodizing) of the first conductive member 310 and the second conductive member 320 may be performed.

A frame structure according to a comparative example may include a metal member. The metal member may form a structure for accommodating or supporting various elements of the electronic device through a die casting process or a mechanical machining process, such as cutting. The second conductive member 320 according to an embodiment may be manufactured in a form of a thin plate through a pressing process, and the nonconductive member 330 may be formed by injection-molding the second conductive member 320 in the form of a thin plate. The nonconductive member 330 formed through the above-described injection-molding process may define a structure (e.g., the one surface 143a of FIG. 3A) for supporting various elements of the electronic device 100 or a recess (e.g., the recess 1431 of FIG. 3B) that may accommodate various elements, together with the second conductive member 320. Accordingly, the frame structure 140 according to an embodiment may be manufactured easily and efficiently and reduce a process time and manufacturing costs as compared with the comparative example. A ratio of a resin to a metal of the frame structure 140 according to an embodiment may be larger than that of the frame structure of the comparative example. In general, because the metal has a specific gravity that is higher than that of a resin, the frame structure 140 according to an embodiment may be lighter than the frame structure according to the comparative embodiment, and may be advantageous in the light weight of the electronic device 100.

Figure 7:
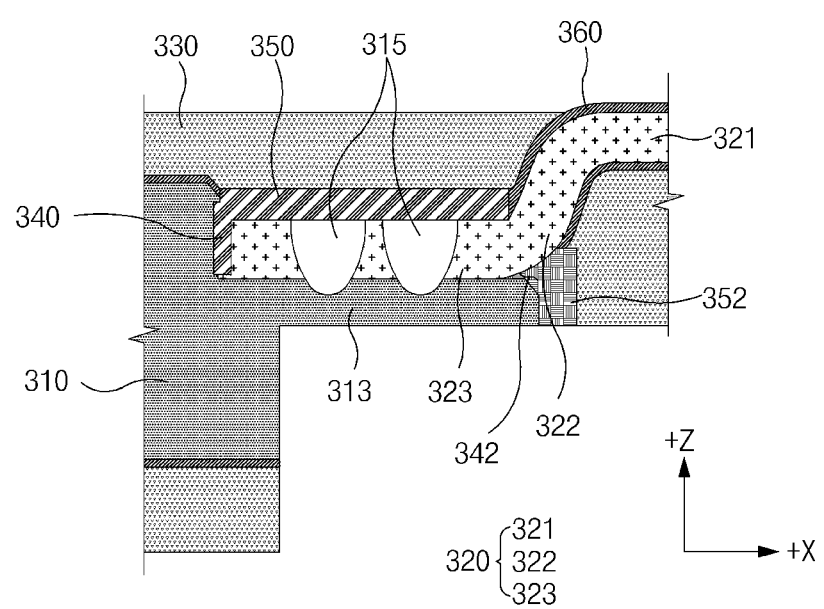
FIG. 7 is a cross-sectional view illustrating a frame structure according to an embodiment of the disclosure.

FIG. 7 is a cross-sectional view illustrating a frame structure according to an embodiment of the disclosure. FIG. 7 may be a cross-sectional view obtaining by cutting the area R1 of FIG. 3A along the X-Z plane.

Referring to FIG. 7, the frame structure 140 of the electronic device 100 according to an embodiment may further include a second conductive connection member 352.

The description of the first conductive connection member 350 may be applied to the description of the second conductive connection member 352 according to an embodiment in substantially the same, similar, or corresponding manner, and a repeated description thereof will be omitted.

In an embodiment, the protruding part 313 of the first conductive member 310 and the second conductive member 320 may be partially spaced apart from each other to define a second gap 342. For example, the protruding part 313 of the first conductive member 310 and the connecting part 322 of the second conductive member 320 may be spaced apart from each other to define the second gap 342. In an embodiment, the second conductive connection member 352 may be at least partially disposed in the second gap 342. In this case, unlike the illustration of FIG. 3C, the bonding layer 360 may not be disposed in an area, in which the second conductive connection member 352 is disposed.

In another embodiment, the second gap 342 may not be formed. For example, unlike the illustration, an end of the protruding part 313 may not include a chamfered part, and the protruding part 313 may be formed to be shorter than the illustration such that an end thereof overlaps the end part 323 of the second conductive member 320. As another example, unlike the illustration, the end of the protruding part 313 may not include a chamfered part, and the connecting part 322 of the second conductive member 320 may extend substantially in parallel to the end part 323. In another embodiment, the second conductive connection member 352 may be disposed to contact both of the protruding part 313 of the first conductive member 310 and the end part 323 (or the connecting part 322) of the second conductive member 320, even when the second gap 342 is not formed.

In an embodiment, the second conductive connection member 352 may enhance an electrical connection between the first conductive member 310 and the second conductive member 320. In an embodiment, in an aspect, in which the second conductive connection member 352 is at least partially disposed in the first coupling structure of the first conductive member 310 and the second conductive member 320 and enhances an electrical connection between the first conductive member 310 and the second conductive member 320, it may be understood that the second conductive connection member 352 is included in the first coupling structure together with the first conductive connection member 350 or forms the first coupling structure together.

In an embodiment, the bonding layer 360 may not be disposed between the second conductive connection member 352 and the nonconductive member 330. In another embodiment, the bonding layer 360 may be interposed between the second conductive connection member 352 and the nonconductive member 330.

In an embodiment, the second conductive connection member 352 may be formed through the substantially the same process as the process of forming the first conductive connection member 350 described with reference FIG. 6. In an embodiment, the process of forming the second conductive connection member 352 may be performed before or after the process of forming the first conductive connection member 350 is performed. In another embodiment, the process of forming the second conductive connection member 352 may be performed together with the process of forming the first conductive connection member 350.

Figure 8:
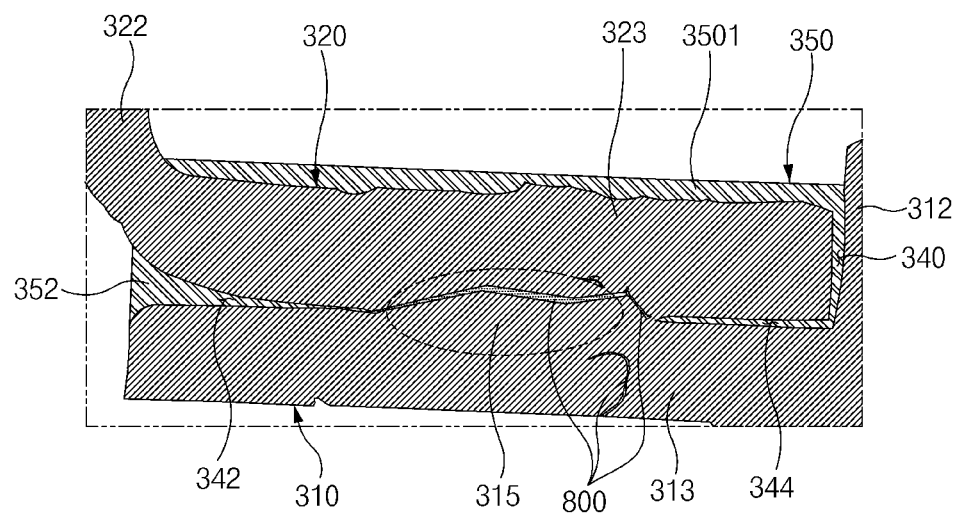
FIG. 8 is a view illustrating a coupling part of a first conductive member and a second conductive member according to an embodiment of the disclosure.

FIG. 8 is a view illustrating the coupling part of a first conductive member and a second conductive member according to an embodiment of the disclosure.

Referring to FIG. 8, in an embodiment, the first conductive member 310 and the second conductive member 320 may be bonded to each other through the bonding part 315.

The first gap 340 may be formed by an assembly tolerance of the first conductive member 310 and the second conductive member 320.

Because the second gap 342 includes a part obtained by bending the connecting part 322 of the second conductive member 320, the second conductive member 320 and the protruding part 313 of the first conductive member 310 may be spaced apart from each other. Furthermore, due to a defect of the bonding process, the second conductive member 320 may come over from the first conductive member 310, and thus the second gap 342 may become wide or deep as compared with a designed size.

Even when the second conductive member 320 according to another embodiment does not include the connecting part 322 or the connecting part 322 does not include a bent part (that is, the end part 323 of the second conductive member 320 extends to be substantially flat over the protruding part 313 of the first conductive member 310), the second gap 342 may be formed due to a defect of the above-described bonding process.

A third gap 344 may be formed as the end part 323 of the second conductive member 320 comes over due to the defect of the bonding process. Because the second conductive member 320 has a thin plate shape manufactured through a pressing process, it has a small thickness so that a vulnerable part such as the second gap 342 and the third gap 344 may be caused due to an environmental factor that is different from a condition of the bonding process. For example, when the first conductive member 310 and the second conductive member 320 are bonded to each other through welding, the second conductive member 320 may be deformed while being melted, and a crack 800 may be generated or destructed due to the fragility thereof. In this case, an electrical connection of the first conductive member 310 and the second conductive member 320 may be degraded. When the first conductive member 310 and the second conductive member 320 are used as antenna radiators, the above-described degradation of the electrical connection may degrade antenna performances (e.g., voltage standing wave ratios (VSWRs) thereof.

In an embodiment, the first conductive connection member 350 may be disposed on the end part 323 of the second conductive member 320. In an embodiment, the first conductive connection member 350 may be at least partially disposed in the first gap 340 and the third gap 344. In an embodiment, the first conductive connection member 350 may electrically connect the first conductive member 310 and the second conductive member 320.

In an embodiment, the second conductive connection member 352 may be at least partially disposed in the second gap 342, and may electrically connect the first conductive member 310 and the second conductive member 320.

In an embodiment, even when the electrical connection is degraded due to the bonding defect of the first conductive member 310 and the second conductive member 320, the electrical connection may be enhanced by the first conductive connection member 350 and the second conductive connection member 352, and a required antenna performance may be satisfied. Through this, an antenna performance deviation due to a deviation of a bonding quality may be reduced, and a loss due to a defective product that fails to satisfy the bonding quality and the antenna performance may be reduced.

In an embodiment, even when the first conductive connection member 350 fails to be filled in the third gap 344 (for example, when a defect is caused after the product is released), the first conductive connection member 350 may enhance the electrical connection between the first conductive member 310 and the second conductive member 320, through at least the first part 3501.

In another embodiment, the first conductive member 310 and the second conductive member 320 may be coupled to each other through a physical connection structure (e.g., coupling through a press-fitting scheme or coupling through a screw). In this case, the electrical connection between the first conductive member 310 and the second conductive member 320 may become lower as compared with the case, in which the first conductive member 310 and the second conductive member 320 are physically and chemically bonded to each other through welding. In an embodiment, even when the first conductive member 310 and the second conductive member 320 are coupled to each other through a physical connection structure, the first conductive connection member 350 and the second conductive connection member 352 may satisfy a required antenna performance by enhancing the electrical connection between the first conductive member 310 and the second conductive member 320.

FIG. 9A is a cross-sectional view illustrating a frame structure according to an embodiment of the disclosure.

Referring to FIG. 9A, the frame structure 940 according to an embodiment may include the first conductive member 910, a second conductive member 920, a nonconductive member 930, a bonding layer 960, and a first conductive connection member 950.

The description made with reference to the frame structure 140, the first conductive member 310, the second conductive member 320, the nonconductive member 330, the bonding layer 360, and the first conductive connection member 350 may be applied to a description of the first conductive member 910, the second conductive member 920, the nonconductive member 930, the bonding layer 960, and the first conductive connection member 950 of the frame structure 940 in substantially the same, similar, or corresponding manner, and thus a repeated description thereof will be omitted.

In an embodiment, the first conductive member 910 may include an outer part 911 (e.g., the outer part 311 of FIG. 3C) and a coupling part 912.

In an embodiment, the coupling part 912 may extend from the outer part 911 in an inward direction of the electronic device 100. For example, the coupling part 912 may extend from the outer part 911 in a direction that faces the center of the electronic device 100. As another example, the coupling part 912 may extend from the outer part 911 toward a side wall located on an opposite side. For example, when the outer part 911 corresponds to a first side wall (e.g., the first side wall 141a of FIG. 3A), the coupling part 912 may extend from the outer part 911 toward a third side wall (e.g., the third side wall 141c of FIG. 3A) that faces the first side wall.

In an embodiment, the coupling part 912 may include a first side surface 912a, a second side surface 912b, and an upper surface 912c that extends from a periphery of the first side surface 912a to the outer part 911. In an embodiment, the coupling part 912 may include a first hole 913 formed between the first side surface 912a and the second side surface 912b. In an embodiment, the first hole 913 may extend in a direction that is different from those of the first side surface 912a and the second side surface 912b. For example, the first side surface 912a may extend in a first direction (e.g., a direction that is inclined in the +x axis direction with respect to the z axis), and the second side surface 912b may extend in a second direction (e.g., the −z axis direction). The first hole 913 may extend in a third direction that is different from the first direction and the second direction. For example, the first hole 913 may extend in a direction (e.g., the −x axis direction) that faces the outer part 911, between the first side surface 912a and the second side surface 912b. In an embodiment, one side of the first hole 913 that faces the outer part 911 may be closed, and the first hole 913 may include a surface 912d that closes the one side. In an embodiment, the first hole 913 may include an inner peripheral surface 9131 that extends from a periphery of the surface 912d. In an embodiment, the inner peripheral surface 9131 of the first hole 913 may extend to an opening part OP formed on the first side surface 912a and the second side surface 912b of the coupling part 912. In an embodiment, the inner peripheral surface 9131 of the first hole 913 may be communicated with the opening part OP, and an opposite side (e.g., an opposite side to the one side) of the first hole 913 may be opened. In an embodiment, the first hole 913 may extend from the opening part OP to an interior of the coupling part 912.

In an embodiment, the second conductive member 920 may include an inner part 921 (e.g., the inner part 321 of FIG. 3C), a connecting part 922 (e.g., the connecting part 322 of FIG. 3C), and an end part 923 (e.g., the end part 323 of FIG. 3C).

In an embodiment, the connecting part 922 may contact the first side surface 912a of the first conductive member 910. However, the disclosure is not limited thereto. For example, when the connecting part 922 of the first conductive member 910 extends substantially in parallel to the end part 923 and/or the first side surface 912a of the first conductive member 910 extends at substantially the same inclination as that of the second side surface 912b, the connecting part 922 may not contact the first side surface 912a of the first conductive member 910.

In an embodiment, the second conductive member 920 may be coupled to the first conductive member 910. In an embodiment, the end part 323 of the second conductive member 920 may be coupled to the coupling part 912 of the first conductive member 910. For example, the second conductive member 920 may be coupled to the first conductive member 910 in a form, in which the end part 323 thereof is inserted into the first hole 913 formed in the coupling part 912. In an embodiment, the end part 323 of the second conductive member 920 may be at least partially accommodated in the first hole 913 of the first conductive member 910. In an embodiment, the end part 323 of the second conductive member 920 may be at least partially disposed in the first hole of the first conductive member 910. In an embodiment, the end part 323 of the second conductive member 920 accommodated in the first hole 913 may at least partially contact the inner peripheral surface 9131 of the first hole 913. In an embodiment, the bonding part 315 may be formed through laser welding performed on the upper surface 912c of the coupling part 912 such that the first conductive member 910 and the second conductive member 920 are bonded to each other. In this case, a distance (or a thickness of the coupling part 912 corresponding to the first side surface 912a) between the upper surface 912c of the coupling part 912 and the end part 323 of the second conductive member 920, which is inserted into the first hole 913, may be determined such that laser welding is possible through the upper surface 912c. However, as described above, a method for physically and electrically connecting the first conductive member 910 and the second conductive member 920 is not limited to welding. In an embodiment, the first conductive member 910 and the second conductive member 920 may be electrically connected to each other, through the above-described coupling structure.

In an embodiment, the first conductive member 910 and/or the second conductive member 920 may be provided with an antenna contact part (not illustrated). In an embodiment, the first conductive member 910 and the second conductive member 920 may be electrically connected to the wireless communication module (e.g., the wireless communication module 1392 of FIG. 13) through the antenna contact part to be operated as antenna radiators.

In an embodiment, the first conductive connection member 950 may be disposed in a coupling part (or a bonding part) of the first conductive member 910 and the second conductive member 920. In an embodiment, the end part 323 of the second conductive member 920 may be spaced apart from the surface 912d of the first hole 913, and the first conductive connection member 950 may be disposed between the end part 323 of the second conductive member 920 and the surface 912d of the first hole 913. In an embodiment, the first conductive connection member 950 may contact the first conductive member 910 and the second conductive member 920. In an embodiment, the first conductive connection member 950 may electrically connect the first conductive member 910 and the second conductive member 920.

An electrical connection of the first conductive member 910 and the second conductive member 920 may be degraded according to an assembly tolerance of the end part 323 of the second conductive member 920 and the first hole 913. As another example, due to a defect of the bonding part 315, the electrical connection of the first conductive member 910 and the second conductive member 920 may be degraded. The first conductive connection member 950 according to an embodiment may enhance the electrical connection of the first conductive member 910 and the second conductive member 920. Through this, degradation of antenna performances of the first conductive member 910 and the second conductive member 920 may be prevented and/or alleviated, and the antenna performances may be enhanced.

The coupling structure of the first conductive member 910 and the second conductive member 920, which has been described with reference to FIG. 9A may be referenced as "a second coupling structure". In an embodiment, in an aspect, in which the first conductive connection member 950 is disposed in the second coupling structure and enhances an electrical connection between the first conductive member 910 and the second conductive member 920, it may be understood that the first conductive connection member 950 is included in the second coupling structure or forms the second coupling structure together.

In an embodiment, the second coupling structure may be applied to the frame structure 140 illustrated in FIG. 3A. For example, the end part 923 of the second coupling structure may be applied to any one or more (e.g., the end part 923 of FIG. 4) of the plurality of protrusions 420 illustrated in FIG. 4. In this case, the first conductive member 310 may include the coupling part 912 having the first hole 913, which corresponds to the protrusion 420, to which the second coupling structure is applied. Similarly to the above-described one, the second coupling structure may be applied to the frame structure 1040 illustrated in FIG. 10A.

Hereinafter, referring to FIGS. 9B, 9C, and 9C, together with FIG. 9A, a process of manufacturing the frame structure 940 according to another embodiment will be described.

Figure 9B:
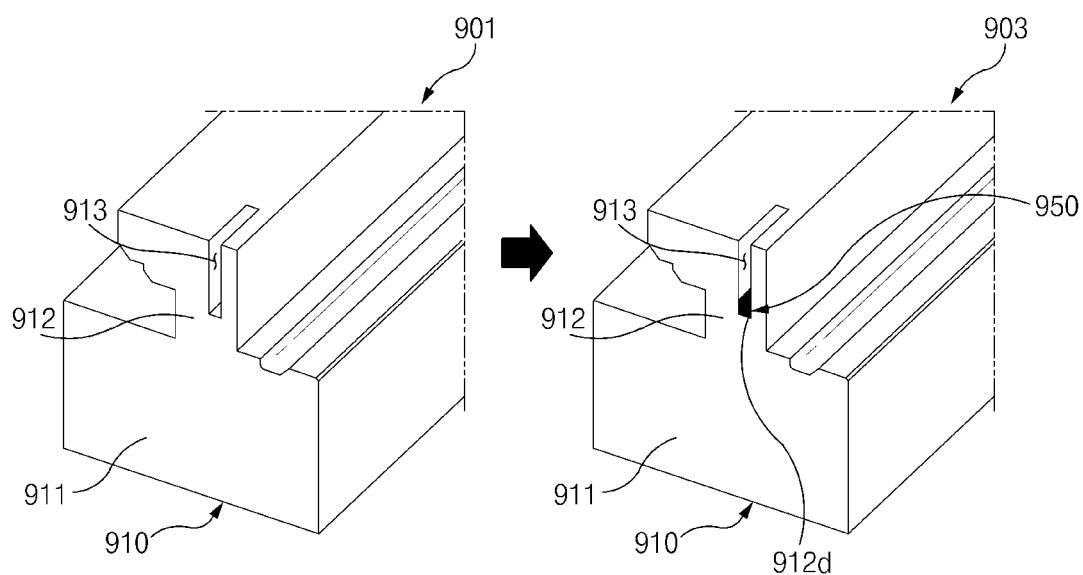
FIG. 9B is a view illustrating a process of forming a first hole and a process of disposing a first conductive connection member in the first hole according to an embodiment of the disclosure.

FIG. 9B is a view illustrating a process of forming a first hole and a process of disposing a first conductive connection member in the first hole according to an embodiment of the disclosure.

Referring to FIG. 9B, with respect to reference numeral 901, the first hole 913 may be formed in the first conductive member 910. For example, the first hole 913 may be formed through a mechanical process such as CNC machining. In an embodiment, a cross-sectional shape of the first hole 913 may be a rectangular shape, but the disclosure is not limited thereto. For example, the first hole 913 may have a shape that is the same as or similar to the end part 323 to accommodate the end part 323 of the second conductive member 920.

Referring to reference numeral 903, the first conductive connection member 950 may be disposed (or formed) in the first hole 913. In an embodiment, the first conductive connection member 950 may include a conductive solution, a conductive deposition layer, or a conductive film. For example, the first conductive connection member 950 may be formed in a scheme, in which the conductive solution is applied in the first hole 913. In an embodiment, because the first conductive member 910 is arranged such that the surface 912d of the first hole 913 faces a gravitational direction as in the illustration of FIG. 9B, flows of the conductive solution to the first hole 913 may be prevented and/or alleviated when the conductive solution is applied. As another example, the first conductive connection member 950 may be formed in a scheme, in which the conductive deposition layer is formed on the surface 912d of the first hole 913 through a deposition process. As another example, the first conductive connection member 950 may be formed in a scheme, in which the conductive film is attached to the surface 912d of the first hole 913.

Figure 9C:
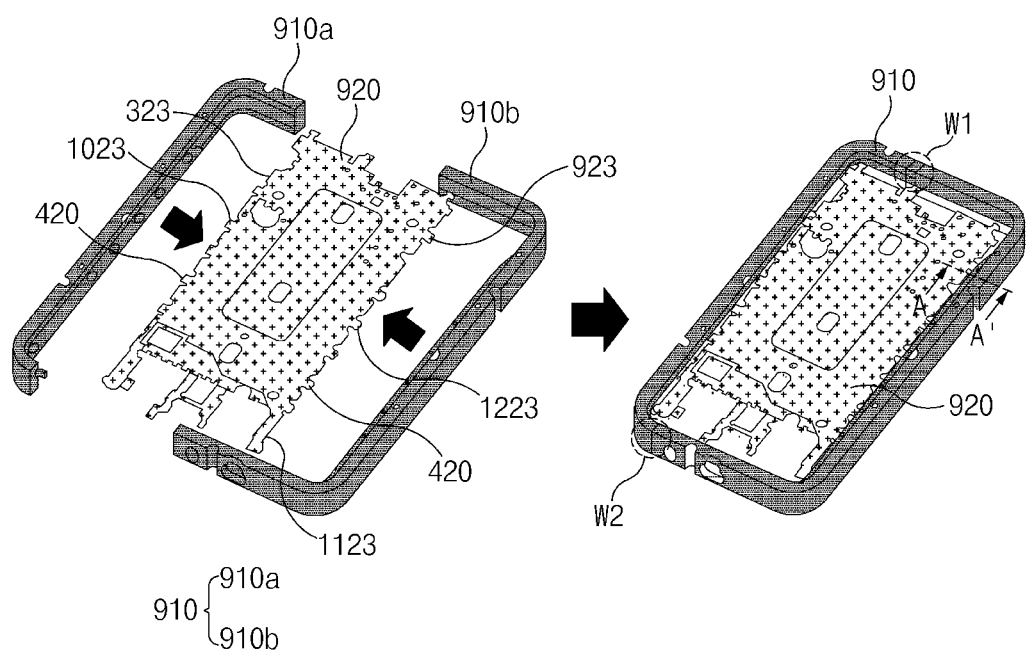
FIG. 9C is a view illustrating a process of coupling a first conductive member and a second conductive member according to an embodiment of the disclosure.

FIG. 9C is a view illustrating a process of coupling the first conductive member 910 and the second conductive member 920 according to an embodiment of the disclosure.

Referring to FIG. 9C, illustration of a spacing space (e.g., the spacing space 383, in which the nonconductive member 330 of FIG. 3A is disposed) defined by the first conductive member 910 and in which the nonconductive member corresponding to the side wall (the side wall 141 of FIG. 3A) is disposed will be omitted for convenience of description.

Figure 9D:
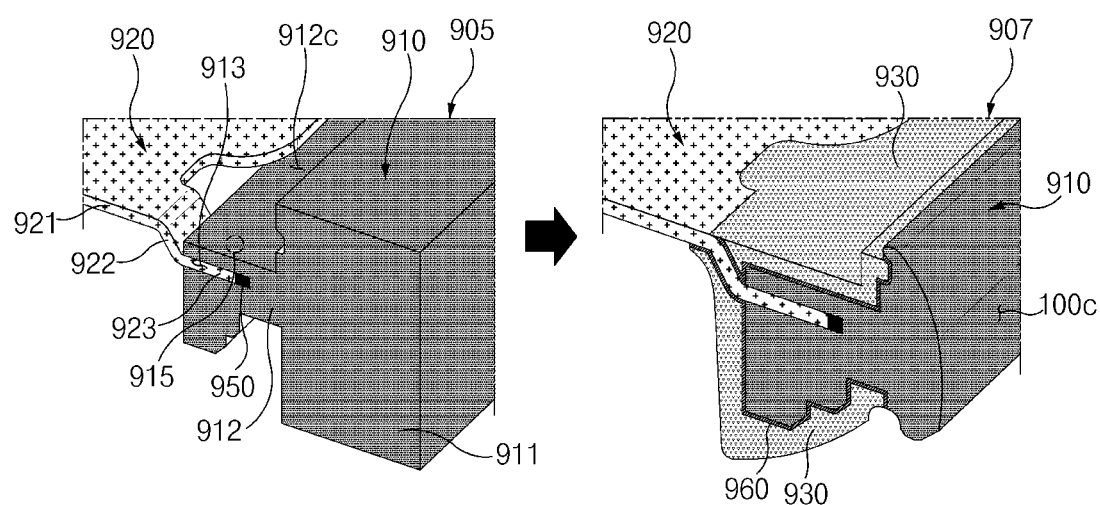
FIG. 9D is a cross-sectional perspective view, taken along line A-A' of FIG. 9C according to an embodiment of the disclosure.

FIG. 9D is a cross-sectional perspective view, taken along line A-A' of FIG. 9C according to an embodiment of the disclosure.

Referring to FIG. 9C, the first conductive member 910 may include the first member 910a and the second member 910b. In an embodiment, the first member 910a and the second member 910b of the first conductive member 910 and the second conductive member 920 may be assembled.

Referring to FIG. 9D together with FIG. 9C, with respect to reference numeral 905, opposite ends of the first member 910a and opposite ends of the second member 910b may contact and/or be connected to each other while the first member 910a and the second member 910b of the first conductive member 910 and the second conductive member 920 are assembled with each other, and the end part 323 of the second conductive member 920 may be inserted into the first hole 913 formed in the second conductive member 920.

In an embodiment, a bonding process, such as laser welding, may be performed on parts W1 and W2, in which the first member 910a and the second member 910b contact and/or be connected to each other. Through the bonding process, the first member 910a and the second member 910b of the first conductive member 910 may be coupled to each other. However, a method for coupling the first member 910a and the second member 910b is not limited to the above-described bonding process, such as welding, but various methods that may be easily used by an ordinary person in the art may be applied.

In an embodiment, the first conductive member 910 and the second conductive member 920 may be coupled (or bonded) to each other. For example, laser welding may be performed on the upper surface 912c of the coupling part 912, which overlaps the second conductive member 920. For example, because the laser welding is performed on a specific portion (or an area) 915, at which the second conductive member 920 and the coupling part 912 overlap each other, the first conductive member 910 and the second conductive member 920 may be coupled to each other.

Referring to reference numeral 907, the bonding layer 960 may be applied onto the first conductive member 910 and the second conductive member 920 to correspond to a location, at which the nonconductive member 930 is formed, and the nonconductive member 930 may be formed through an injection-molding process after the bonding layer 960 is applied. After the injection-molding process, a process of machining and surface-treating the third surface 100C may be performed. The above description made with reference to FIG. 3C may be applied to the process of applying the bonding layer 960, the process of injection-molding the nonconductive member 930, and the process for the third surface 100C in substantially the same, similar, or corresponding manner.

Figure 10A:
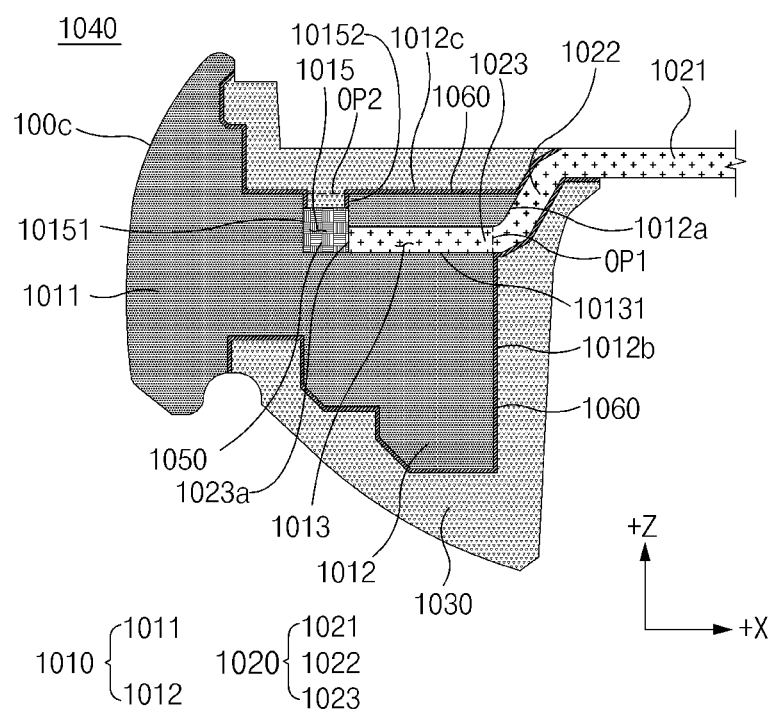
FIG. 10A is a cross-sectional view illustrating a frame structure according to an embodiment of the disclosure.

FIG. 10A is a cross-sectional view illustrating a frame structure according to an embodiment of the disclosure.

Referring to FIG. 10A, the frame structure 1040 according to an embodiment may include a first conductive member 1010, a second conductive member 1020, a nonconductive member 1030, a bonding layer 1060, and a first conductive connection member 1050.

The description of the first conductive member 910 made with reference to FIG. 9A may be applied to a description of the first conductive member 1010 according to an embodiment in substantially the same, similar, or corresponding manner. For example, the description of the first conductive member 310 made with reference to FIG. 3C may be applied to a description of the first conductive member 1010 in substantially the same, similar, or corresponding manner. For example, the first conductive member 1010 may include an outer part 1011 and a coupling part 1012. The outer part 1011 may define the third surface 100C of the electronic device 100, together with the nonconductive member 1030 corresponding to the side wall. For example, the coupling part 1012 of the first conductive member 1010 may extend from the outer part 1011 in an inward direction of the electronic device 100. For example, the coupling part 1012 may include a first side surface 1012a, a second side surface 1012b, and an upper surface 1012c.

In an embodiment, the upper surface 1012c of the coupling part 1012 may extend from a periphery of the first side surface 1012a to the outer part 1011.

In an embodiment, the coupling part 1012 may include a first hole 1013, and a second hole 1015 communicated with the first hole 1013. In an embodiment, the first hole 1013 may extend in a first direction (e.g., the x axis direction), and the second hole 1015 may extend in a second direction (e.g., the y axis direction) that is different from the first direction. In an embodiment, the first hole 1013 may include a first inner peripheral surface 10131, and the second hole 1015 may include a second inner peripheral surface 10151. In an embodiment, the first inner peripheral surface 10131 may extend from the second inner peripheral surface 10151 to the first side surface 1012a and the second side surface 1012b of the coupling part 1012. In an embodiment, the first inner peripheral surface 10131 of the first hole 1013 may be communicated with a first opening part OP1 formed on the first side surface 1012a and the second side surface 1012b, and one side (one side in the +x axis direction) of the first hole 1013 may be opened through the first opening part OP1. In an embodiment, an opposite side of the first hole 1013, in an opposite direction (e.g., the −x axis direction) to the one side may be communicated with the second hole 1015. In an embodiment, the second hole 1015 may extend from the first hole 1013 to the upper surface 1012c of the coupling part 1012. In an embodiment, the second inner peripheral surface 10151 of the second hole 1015 may extend from the first inner peripheral surface 10131 to the upper surface 1012c. In an embodiment, the second inner peripheral surface 10151 of the second hole 1015 may be communicated with a second opening part OP2 formed on the upper surface 1012c, and one side (one side in the +z axis direction) of the second hole 1015 may be opened through the second opening part OP2.

The description of the second conductive member 920 made with reference to FIG. 9A may be applied to a description of the second conductive member 1020 according to an embodiment in substantially the same, similar, or corresponding manner. For example, the description of the second conductive member 320 made with reference to FIG. 3C may be applied to a description of the second conductive member 1020 in substantially the same, similar, or corresponding manner. For example, the second conductive member 1020 may include an inner part 1021, a connecting part 1022, and an end part 1023.

In an embodiment, the end part 1023 of the second conductive member 1020 may be at least partially accommodated in the first hole 1013 and the second hole 1015 of the first conductive member 1010. In an embodiment, the end part 1023 of the second conductive member 1020 may at least partially contact the first inner peripheral surface 10131 of the first hole 1013. In an embodiment, the first conductive member 1010 and the second conductive member 1020 may be bonded to each other through welding through the upper surface 1012c of the coupling part 1012 (however, the disclosure is not limited thereto). Through the above-described coupling structure, the first conductive member 1010 and the second conductive member 1020 may be electrically connected to each other.

According to an embodiment, the end part 1023 of the second conductive member 1020 may include a surface 1023a that defines an end thereof. As illustrated, the surface 1023a of the end part 1023 may be arranged on a surface 10152 of the second inner peripheral surface 10151 of the second hole 1015, which faces the first side surface 1012a. For example, the surface 1023a of the end part 1023 may be arranged with the surface 10152 of the second hole 1015, with respect to the z axis. In another embodiment, the end part 1023 of the second conductive member 1020 may extend further than in the illustrated example such that the surface 1023a thereof is located on the second inner peripheral surface 10151 of the second hole 1015. In another embodiment, the end part 1023 of the second conductive member 1020 may extend less than in the illustrated example such that the surface 1023a thereof is spaced apart from the second inner peripheral surface 10151 of the second hole 1015.

In an embodiment, the first conductive member 1010 and/or the second conductive member 1020 may be provided with an antenna contact part (not illustrated). The first conductive member 1010 and the second conductive member 1020 may be electrically connected to the wireless communication module through the antenna contact part to be operated as antenna radiators.

In an embodiment, the first conductive connection member 1050 may be disposed in a coupling part (or a bonding part) of the first conductive member 1010 and the second conductive member 1020. In an embodiment, the first conductive connection member 1050 may be at least partially disposed in the first hole 1013 and/or the second hole 1015. In an embodiment, the first conductive connection member 1050 may be disposed in the first hole 1013 and/or the second hole 1015 to at least partially contact the first conductive member 1010 and the second conductive member 1020. For example, the first conductive connection member 1050 may be disposed in the second hole 1015 to contact the end part 1023 of the second conductive member 1020. The first conductive connection member 1050 disposed in the second hole 1015 may contact the second inner peripheral surface 10151 of the second hole 1015 to contact the first conductive member 1010. For example, the first conductive connection member 1050 may be disposed between the end part 1023 of the second conductive member 1020 and the second opening part OP2 communicated with the second hole 1015. As another example, the first conductive connection member 1050 may be disposed in the second hole 1015 to define the upper surface 1012c together with the coupling part 1012. When the first conductive connection member 1050 is partially formed in the first hole 1013 and/or the second hole 1015, the nonconductive member 1030 may be disposed in the remaining portions of the first hole 1013 and/or the second hole 1015 to cover the first conductive connection member 1050.

In an embodiment, the first conductive connection member 1050 may contact the first conductive member 1010 and the second conductive member 1020. In an embodiment, the first conductive connection member 1050 may electrically connect the first conductive member 1010 and the second conductive member 1020. The description made with reference to the first conductive connection member 350 and/or the first conductive connection member 950 may be applied to a description of the first conductive connection member 1050 according to an embodiment in substantially the same as, similar, or corresponding manner. For example, an electrical connection of the first conductive member 1010 and the second conductive member 1020 may be degraded according to an assembly tolerance of the end part 1023 of the second conductive member 1020 and the first hole 1013 and/or a defect of the bonding part (not illustrated). The first conductive connection member 1050 according to an embodiment may enhance an electrical connection of the first conductive member 1010 and the second conductive member 1020, may prevent and/or alleviate a defect of performance of the antennas including the first conductive member 1010 and the second conductive member 1020, and may enhance the performance of the antennas.

In an embodiment, the bonding layer 1060 (e.g., the bonding layer 360 of FIG. 3C or the bonding layer 960 of FIG. 9A) may include a first layer (e.g., the first layer 361 of FIG. 3C) disposed between the first conductive member 1010 and the nonconductive member 1030, and a second layer (e.g., the second layer 362 of FIG. 3C) interposed between the second conductive member 1020 and the nonconductive member 1030. As described above, in an embodiment, the bonding layer 1060 may not be formed on the first conductive connection member 1050. The bonding layer 1060 may not be disposed in the second hole 1015. However, the disclosure is not limited thereto, and unlike the illustration of FIG. 10A, in another embodiment, the bonding layer 1060 may be formed on the first conductive connection member 1050 to be at least partially disposed in the second hole 1015. In this case, the bonding layer 1060 may be interposed between the nonconductive member 1030 and the first conductive connection member 1050.

The coupling structure of the first conductive member 1010 and the second conductive member 1020, which has been described with reference to FIG. 10A, may be referenced as "a third coupling structure". In an embodiment, in an aspect, in which the first conductive connection member 1050 is at least partially disposed in the third coupling structure and enhances an electrical connection between the first conductive member 1010 and the second conductive member 1020, it may be understood that the first conductive connection member 1050 is included in the third coupling structure or forms the third coupling structure together.

In an embodiment, the third coupling structure may be applied to the frame structure 140 illustrated in FIG. 3A or the frame structure 940 illustrated in FIG. 9A. For example, the end part 1023 of the third coupling structure may be applied to any one or more (e.g., the end part 1023 of FIG. 9C) of the plurality of protrusions 420 illustrated in FIG. 4 or FIG. 9C. In this case, the first conductive member may include the coupling part 1012, the first hole 1013, and the second hole 1015, which correspond to the protrusion 420, to which the third coupling structure is applied.

Figure 10B:
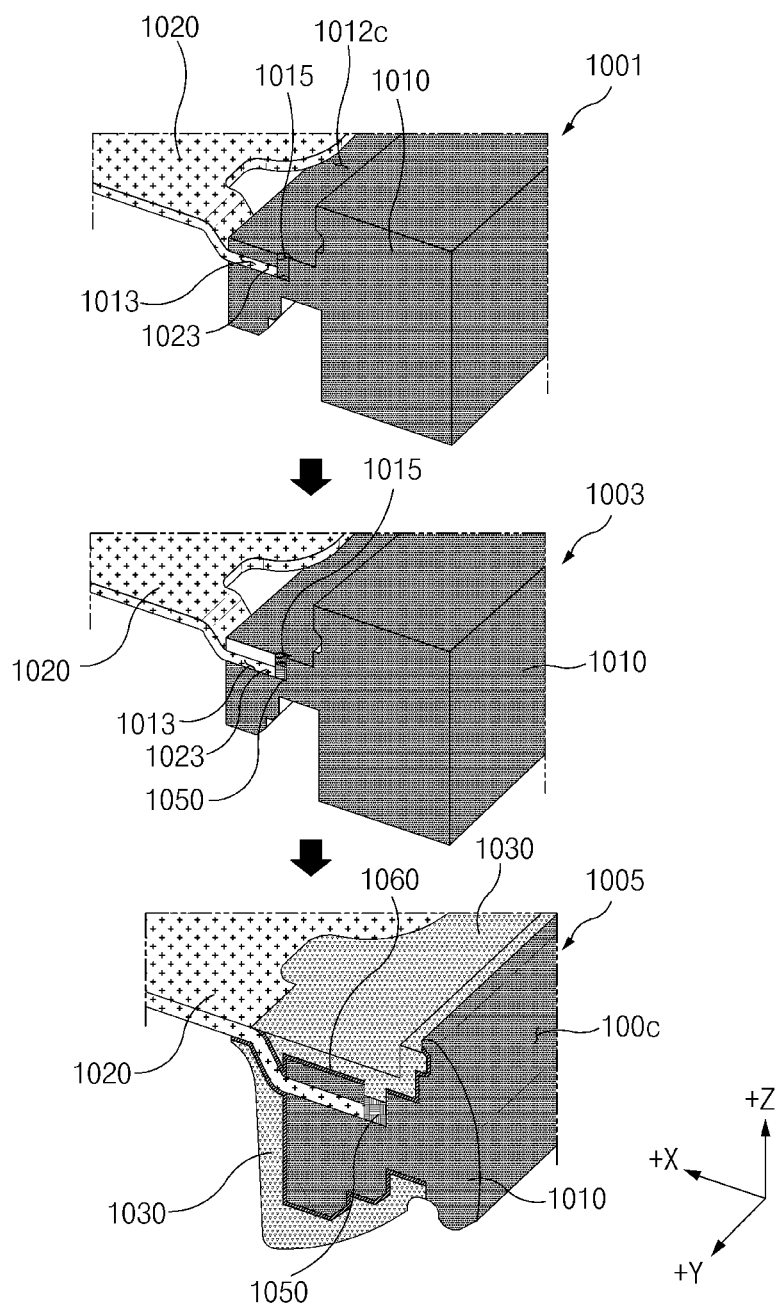
FIG. 10B is a view illustrating a process of manufacturing a frame structure according to an embodiment of the disclosure.

FIG. 10B is a view illustrating a process of manufacturing a frame structure according to an embodiment of the disclosure.

Referring to FIG. 10B, a process of manufacturing a frame structure 1040 according to an embodiment will be described.

Referring to reference numeral 1001 of FIG. 10B, the first conductive member 1010 and the second conductive member 1020 may be provided. The first hole 1013 and the second hole 1015 may be formed in the first conductive member 1010 through mechanical machining. Thereafter, as in the description made with reference to FIG. 9C, the first conductive member 1010 and the second conductive member 1020 may be assembled. For example, the first conductive member 1010 may include a first member (e.g., the first member 910a of FIG. 9C) and a second member (e.g., the second member 910b of FIG. 9C). Opposite ends of the first member and the second member may be connected to each other while the first member and the second member of the first conductive member 1010, and the second conductive member 1020 are assembled, and the end part 1023 of the second conductive member 1020 may be inserted into the first hole 1013 of the first conductive member 1010. After the second conductive member 1020 is inserted into the first hole 1013, the end part 1023 of the second conductive member 1020 and the first conductive member 1010 may be bonded to each other. For example, the first conductive member 1010 and the second conductive member 1020 may be bonded to each other by performing laser welding on the upper surface 1012c of the first conductive member 1010, which overlaps the end part 1023 of the first conductive member 1010, but the disclosure is not limited to the above-described example.

Referring to reference numeral 1003 of FIG. 10B, the first conductive connection member 1050 may be disposed in the second hole 1015. The descriptions of the first conductive connection member 350 and the first conductive connection member 950 made with reference to FIGS. 6 and 9B may be applied to a description of a process for disposing the first conductive connection member 1050 in substantially the same, similar, or corresponding manner.

In another embodiment, the first conductive connection member 1050 may be disposed in the first hole 1013 and/or the second hole 1015 before the first conductive member 1010 and the second conductive member 1020 are assembled with each other.

Referring to reference numeral 1005 of FIG. 10B, the bonding layer 1060 may be applied onto the first conductive member 1010 and the second conductive member 1020 to correspond to a location, at which the nonconductive member 1030 is formed. The bonding layer 1060 may be applied onto the first conductive member 1010, and unlike the illustration, may not be applied onto the first conductive member 1010. After the bonding layer 1060 is applied, the nonconductive member 1030 may be formed through an injection-molding process. After the injection-molding process, a process of machining and surface-treating the third surface 100C may be performed. The description of the process of applying the bonding layer 360, the process of injection-molding the nonconductive member 330, and the process of treating the third surface 100C of the frame structure 140, which have been made with reference to FIG. 3C, may be applied to the process of applying the bonding layer 1060, the process of injection-molding the nonconductive member 1030, and the process of treating the third surface 100C, which have been made above, in substantially the same, similar, or corresponding manner.

Figure 11A:
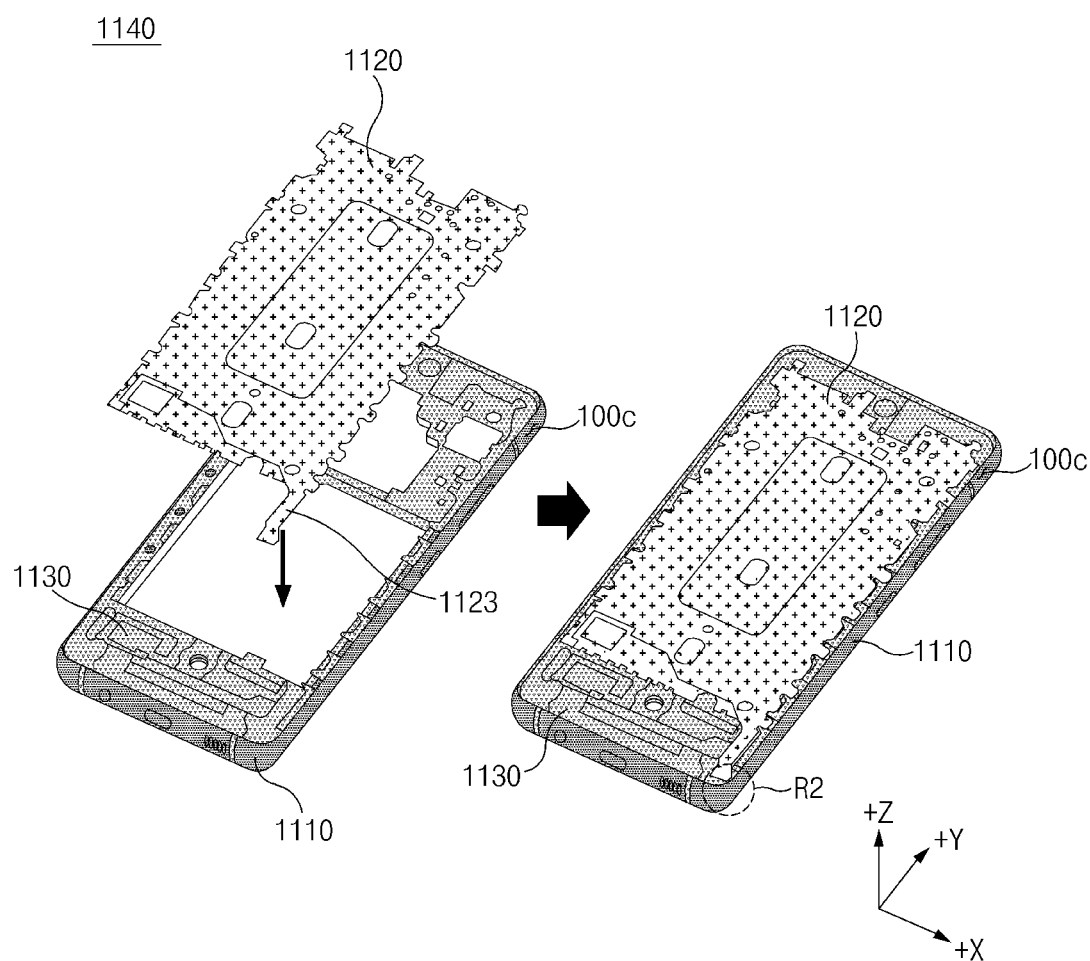
FIG. 11A is a view illustrating a process of manufacturing a frame structure according to an embodiment of the disclosure.

FIG. 11A is a view illustrating a process of manufacturing a frame structure according to an embodiment of the disclosure.

Figure 11B:
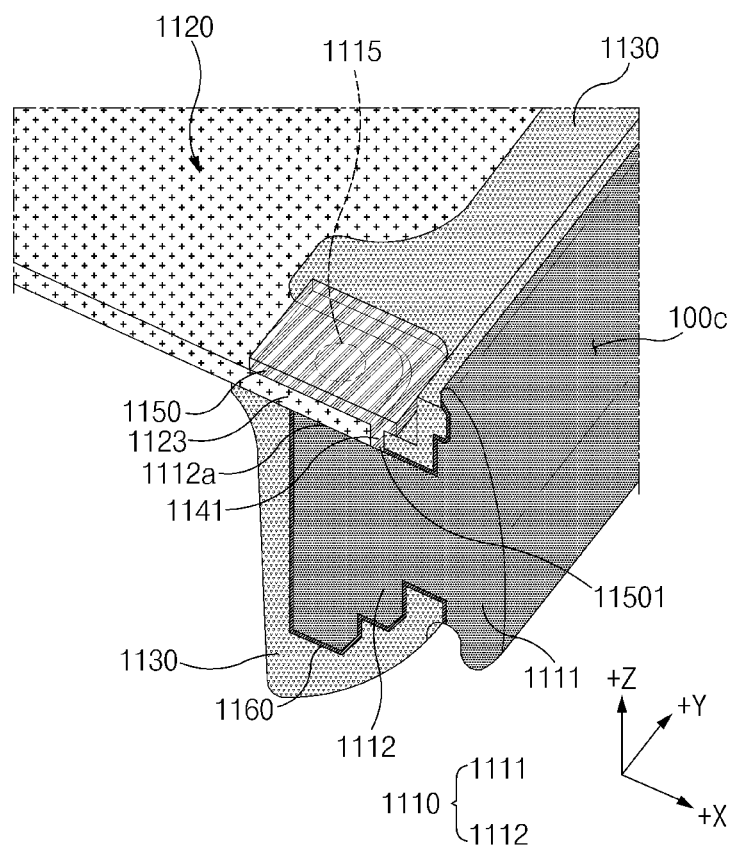
FIG. 11B is a cross-sectional perspective view corresponding to an area R2 of FIG. 11A according to an embodiment of the disclosure.

FIG. 11B is a cross-sectional perspective view corresponding to an area R2 of FIG. 11A according to an embodiment of the disclosure. FIG. 11B may be a sectional perspective view obtained by cutting the area R2 of FIG. 11A by the X-Z plane according to an embodiment of the disclosure.

Referring to FIGS. 11A and 11B, a frame structure 1140 according to an embodiment may include a first conductive member 1110, a second conductive member 1120, a nonconductive member 1130, a bonding layer 1160, and a first conductive connection member 1150.

The description made with reference to the frame structures 340, 940, and 1040, the first conductive members 310, 910, and 1010, the second conductive members 320, 920, and 1030, the nonconductive members 330, 930, and 1030, the bonding layers 360, 960, and 1060, and the first conductive connection members 350, 950, and 1050 may be applied to a description of the frame structure 1140, the first conductive member 1110, the second conductive member 1120, the nonconductive member 1130, the bonding layer 1160, and the first conductive connection member 1150 according to an embodiment in substantially the same, similar, or corresponding manner, and thus a repeated description thereof will be omitted.

In an embodiment, the first conductive member 1110 and the second conductive member 1120 may be formed of different materials. For example, the first conductive member 1110 may be formed of aluminum or an aluminum-based alloy and the second conductive member 1120 may be formed of magnesium or a magnesium-based alloy, but the disclosure is not limited thereto. In another embodiment, the first conductive member 1110 and the second conductive member 1120 may be formed of substantially the same material.

In an embodiment, the first conductive member 1110 may be coupled to the nonconductive member 1130 through an application process and an injection-molding process of the bonding layer 1160 before being coupled to the second conductive member 1120. For the first conductive member 1110 coupled to the nonconductive member 1130, the third surface 100C of the electronic device 100 may be machined and an external surface treating process, such as anodizing, may be performed. In an embodiment, because an injection-molding process is performed before the first conductive member 1110 is coupled to the second conductive member 1120, the bonding layer 1160 may be interposed only between the first conductive member 1110 and the nonconductive member 1130.

The second conductive member 1120 may be manufactured in a form of a thin plate through rolling and pressing processes. Thereafter, a surface treating process may be performed on the second conductive member 1120.

In an embodiment, after the surface treating process on the first conductive member 1110 and the second conductive member 1120 is finished, the second conductive member 1120 may be coupled to the first conductive member 1110, to which the nonconductive member 1130 is coupled. For example, referring to FIG. 11B, a coupling part 1112 of the first conductive member 1110 according to an embodiment may include an upper surface 1112a that extends substantially in parallel to an end part 1123 of the second conductive member 1120. In an embodiment, the upper surface 1112a of the first conductive member 1110 may define a stepped part (e.g., the stepped part 325 of FIG. 3C) together with the nonconductive member 1130. In an embodiment, the second conductive member 1120 may be assembled with the first conductive member in a form, in which the end part 1123 is disposed in the stepped part including the upper surface 1112a of the coupling part 1112. In an embodiment, the second conductive member 1120 may be spaced apart from the first conductive member 1110 coupled to the nonconductive member 1130, while a first gap 1141 being interposed therebetween.

The first conductive member 1110 and the second conductive member 1120 may be bonded to each other through a bonding part 1115, by performing welding after being assembled. However, as described above, a method for mechanically and electrically connecting the first conductive member 1110 and the second conductive member 1120 is not limited to a welding process.

Through the above-described coupling structure of the first conductive member 1110 and the second conductive member 1120, the first conductive member 1110 and the second conductive member 1120 may be electrically connected to each other.

In an embodiment, after the first conductive member 1110 and the second conductive member 1120 are bonded to each other, the first conductive connection member 1150 may be disposed. In an embodiment, the first conductive connection member 1150 may be disposed in a coupling part (or a bonding part) of the first conductive member 1110 and the second conductive member 1120. In an embodiment, the first conductive connection member 1150 may be disposed on the end part 1123 of the second conductive member 1120. In an embodiment, the first conductive connection member 1150 may be disposed on the end part 1123 of the second conductive member 1120 to cover the bonding part 1115. In an embodiment, the first conductive connection member 1150 may be at least partially disposed in the first gap 1141. For example, the first conductive connection member 1150 may include a part 11501 (e.g., the second part 3502 of FIG. 3C) disposed in the first gap 1141. In an embodiment, because the first conductive connection member 1150 is disposed after the injection-molding process, the first conductive connection member 1150 may not be covered by the nonconductive member 1130. Furthermore, the first conductive connection member 1150 may include a part that is disposed on the nonconductive member 1130 over the first gap 1141.

In an embodiment, the first conductive connection member 1150 may electrically connect the first conductive member 1110 and the second conductive member 1120. In an embodiment, the first conductive connection member 1150 may enhance an electrical connection between the first conductive member 1110 and the second conductive member 1120.

It is illustrated that the first conductive connection member 1150 is disposed in the first gap 1141, but the disclosure is not limited to the illustrated embodiment. For example, the first conductive connection member 1150 according to another embodiment may not be disposed in the first gap 1141. Accordingly, even when areas of the first conductive connection member 1150, which contact the first conductive member 1110 and the second conductive member 1120, vary, an electrical connection that is required between the first conductive member 1110 and the second conductive member 1120 may be secured by changing characteristics (e.g., an electric conductivity) of the first conductive connection member 1150.

The coupling structure of the first conductive member 1110 and the second conductive member 1120, which has been described with reference to FIGS. 11A and 11B, may be referenced as "a fourth coupling structure". In an embodiment, in an aspect, in which the first conductive connection member 1150 is at least partially disposed in the fourth coupling structure and enhances an electrical connection between the first conductive member 1110 and the second conductive member 1120, it may be understood that the first conductive connection member 1150 is included in the fourth coupling structure or forms the fourth coupling structure together.

It has been described that for the embodiment including the fourth coupling structure, which has been described with reference to FIGS. 11A and 11B, an injection-molding process for the first conductive member 1110 may be performed first before the process of coupling the first conductive member 1110 and the second conductive member 1120. However, in spite of the description, it is not limited to the fourth coupling structure that may be applied only when the injection-molding process for the first conductive member 1110 is performed first before the coupling process of the first conductive member 1110 and the second conductive member 1120. For example, the fourth coupling structure may be applied even though the injection-molding process is performed to manufacture the frame structure after the first conductive member and the second conductive member are coupled to each other. For example, the end part 1123 of the fourth coupling structure may be applied to any one or more (e.g., the end part 1123 of FIG. 9C) of the plurality of protrusions 420 illustrated in FIG. 4 or FIG. 9C. In an embodiment, the first conductive connection member 1150 may be disposed in a coupling part of the first conductive member 1110 and the second conductive member 1120, before the injection-molding process. During the injection-molding process, the bonding layer 1160 and the nonconductive member 1130 may not be formed on the first conductive connection member 1150 of the fourth coupling structure.

Figure 12A:
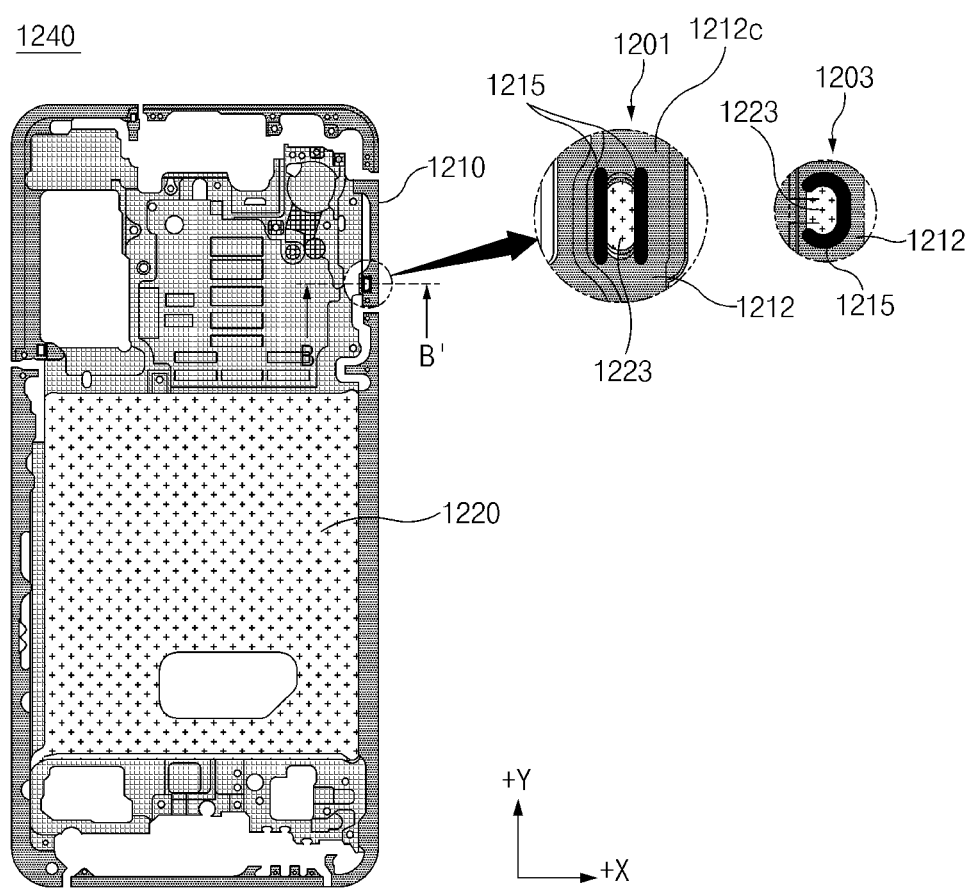
FIG. 12A is a view illustrating a frame structure according to an embodiment of the disclosure.

FIG. 12A is a view illustrating a frame structure according to an embodiment of the disclosure.

In FIG. 12A, illustration of a nonconductive part (e.g., the nonconductive member 330 of FIG. 12B) is omitted.

Figure 12B:
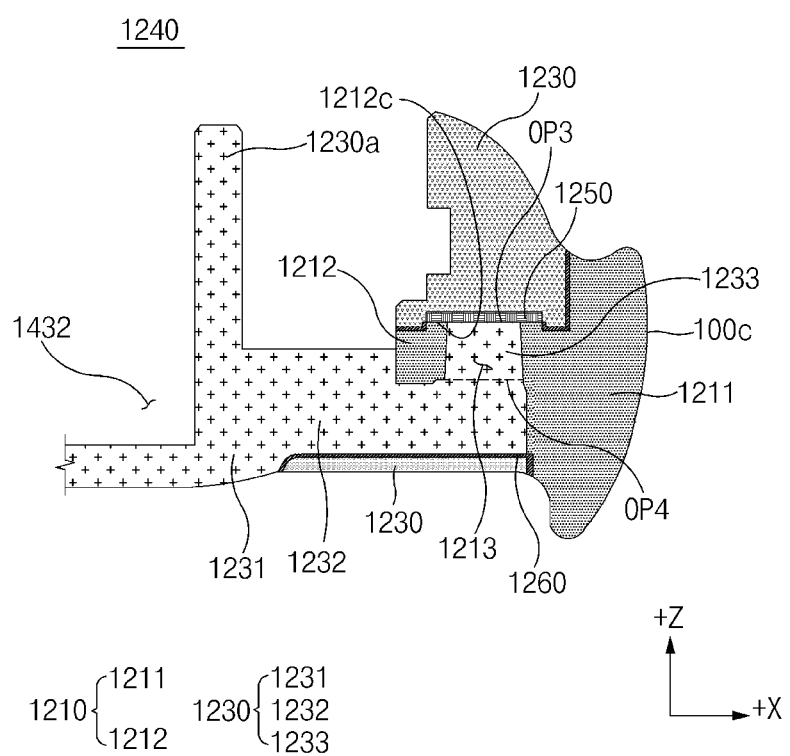
FIG. 12B is a cross-sectional view taken along line B-B' of FIG. 12A according to an embodiment of the disclosure.

FIG. 12B is a cross-sectional view taken along line B-B' of FIG. 12A according to an embodiment of the disclosure.

Referring to FIGS. 12A and 12B, a frame structure 1240 may include a first conductive member 1210, a second conductive member 1220, and a first conductive connection member 1250.

The description made with reference to the first conductive members 310, 910, 1010, and 1110, which have been described above, may be at least partially applied to the first conductive member 1210 according to an embodiment in substantially the same, similar, or corresponding manner, and a repeated description thereof will be omitted.

In an embodiment, the first conductive member 1210 may include an outer part 1211 and a coupling part 1212 that extends from the outer part 1211 in an inward direction of the electronic device 100. In an example, the coupling part 1212 may extend from the outer part 1211 toward a side wall located on an opposite side. In an embodiment, the coupling part 1212 may extend in a direction (e.g., the −x axis direction) that is substantially perpendicular to the third surface 100C.

In an embodiment, a through-hole 1213 may be formed in the coupling part 1212. In an embodiment, the through-hole 1213 may communicate a third opening part OP3 formed on an upper surface 1212c of the coupling part 1212, and a fourth opening part OP4 formed on a surface of the coupling part 1212, which faces the opposite direction to the upper surface 1212c.

In an embodiment, the second conductive member 1220 may include an inner part 1221, a connecting part 1222, and an end part 1223. In an embodiment, the second conductive member 1220 may be manufactured through casting or mechanical machining. Because the second conductive member 1220 is formed through the casting or the mechanical machining, the inner part 1221 of the second conductive member 1220 may include a partition wall 1230a. The inner part 1221 of the second conductive member 1220 may define a recess 1432 for accommodating various elements of the electronic device 100, together with the partition wall 1230a.

In an embodiment, the connecting part 1222 of the second conductive member 1220 may extend from the inner part 1221 toward the outer part 1211 of the first conductive member 1210. For example, the connecting part 1222 may extend from the inner part 1221 in the +x axis direction. In an embodiment, the connecting part 1222 of the second conductive member 1220 may at least partially overlap the coupling part 1212 of the first conductive member 1210. For example, with reference to the illustration of FIG. 12B, the connecting part 1222 of the second conductive member 1220 may be located on a lower side (e.g., in the −z axis direction) of the coupling part 1212 of the first conductive member 1210.

In an embodiment, the end part 1223 of the second conductive member 1220 may extend in a direction that is different from a direction, in which the connecting part 1222 extends. In an embodiment, the end part 1223 of the second conductive member 1220 may extend from the connecting part 1222 toward the through-hole 1213 of the first conductive member 1210. In an embodiment, the end part 1223 of the second conductive member 1220 may pass through the fourth opening part OP4 of the through-hole 1213, and may extend to the third opening part OP3 of the through-hole 1213. In an embodiment, the end part 1223 of the second conductive member 1220 may be at least partially accommodated in the through-hole 1213 of the first conductive member 1210.

In an embodiment, the end part 1223 and the through-hole 1213 of the second conductive member 1220 may be formed such that a diameter thereof decreases as it goes to the upper surface 1212c of the coupling part 1212 whereby the second conductive member 1220 is easily assembled in the through-hole 1213 of the first conductive member 1210. However, the disclosure is not limited thereto.

In an embodiment, the end part 1223 of the second conductive member 1220 may be coupled to the through-hole 1213 to define substantially the same plane as the upper surface 1212c of the coupling part 1212. In an embodiment, the end part 1223 of the second conductive member 1220 may be exposed through the upper surface 1212c of the coupling part 1212 while being coupled to the through-hole 1213. In an embodiment, the end part 1223 of the second conductive member 1220 may be bonded to the coupling part 1212 of the first conductive member 1210 while being inserted into the through-hole 1213. For example, referring to FIG. 12A, the end part 1223 of the second conductive member 1220, which is exposed through the upper surface 1212c of the coupling part 1212, may be bonded to the first conductive member 1210 in at least one section along a border between the first conductive member 1210 and the coupling part 1212. For example, referring to reference numeral 1201 of FIG. 12A, the first conductive member 1210 and the second conductive member 1220 may be bonded to each other as a bonding part 1215 is formed through welding in two sections that are separated from each other and extend along the border. As another example, referring to reference numeral 1203 of FIG. 12A, the first conductive member 1210 and the second conductive member 1220 may be bonded to each other as the bonding part 1215 is formed through welding in one section that extends along the border.

Through the above-described coupling structure of the first conductive member 1210 and the second conductive member 1220, the first conductive member 1210 and the second conductive member 1220 may be electrically connected to each other.

Referring to FIGS. 12A and 12B, in an embodiment, after the first conductive member 1210 and the second conductive member 1220 are bonded to each other, the first conductive connection member 1250 may be disposed. In an embodiment, the first conductive connection member 1250 may be disposed on the upper surface 1212c of the coupling part 1212 and the end part 1223 of the first conductive member 1210, which forms the same plane as the upper surface 1212c, to cover the bonding part 1215. In an embodiment, the first conductive connection member 1250 may protect the bonding part 1215 from an external environment.

In an embodiment, a bonding layer 1260 may be at least partially applied onto the first conductive member 1210 and the second conductive member 1220 to correspond to a location, at which a nonconductive member 1230 is formed. For example, the bonding layer 1260 may be at least partially disposed between the first conductive member 1210 and the nonconductive member 1230, and may be at least partially disposed between the second conductive member 1220 and the nonconductive member 1230. In an embodiment, the bonding layer 1260 may not be formed on the first conductive connection member 1250, but the disclosure is not limited thereto. For example, unlike the illustration, the bonding layer 1260 also may be applied onto the first conductive connection member 1250.

In an embodiment, after the bonding layer 1260 is applied, the nonconductive member 1230 may be formed through an injection-molding process. In an embodiment, the nonconductive member 1230 may be formed on the bonding layer 1260. Furthermore, the nonconductive member 1230 may be formed on the first conductive connection member 1250. In another embodiment, when the bonding layer 1260 is also applied onto the first conductive connection member 1250, the nonconductive member 1230 may be formed on the bonding layer 1260 applied to the first conductive connection member 1250.

In an embodiment, the nonconductive member 1230 may be formed to at least partially surround the coupling part of the first conductive member 1210 and the second conductive member 1220.

In an embodiment, an antenna contact part that is not illustrated may be formed in the first conductive member 1210 and/or the second conductive member 1220. Through the antenna contact part, the first conductive member 1210 and/or the second conductive member 1220 may be operatively connected to the wireless communication circuit.

In an embodiment, the first conductive connection member 1250 may electrically connect the first conductive member 1210 and the second conductive member 1220, may compensate for degradation of an electrical connection due to an assembly tolerance and/or a bonding defect between the first conductive member 1210 and the second conductive member 1220. For example, even when the electrical connection is degraded due to the assembly tolerance and/or the bonding defect between the first conductive member 1210 and the second conductive member 1220, the first conductive connection member 1250 may enhance the electrical connection between the first conductive member 1210 and the second conductive member 1220. Through this, degradation of performances of the antennas including the first conductive member 1210 and the second conductive member 1220 may be prevented and/or alleviated.

The coupling structure of the first conductive member 1210 and the second conductive member 1220, which has been described with reference to FIGS. 12A and 12B, may be referenced as "a fifth coupling structure". In an embodiment, in an aspect, in which the first conductive connection member 1250 is at least partially disposed in the fifth coupling structure and enhances an electrical connection between the first conductive member 1210 and the second conductive member 1220, it may be understood that the first conductive connection member 1250 is included in the fifth coupling structure or forms the fifth coupling structure together.

It has been described in the embodiment including the fifth coupling structure, which has been described with reference to FIGS. 12A and 12B that the second conductive member 1220 is formed through a die casting process, instead of in a form of a thin plate. However, it is not limited to that the fifth coupling structure cannot applied to the frame structure (e.g., the frame structures 140, 940, 1040, and 1140) including the second conductive member having a this plate shape, due to the description. Even when the second conductive member has the thin plate shape, the fifth coupling structure may be applied. For example, the end part 1223 of the fifth coupling structure may be applied to any one or more (e.g., the end part 1223 of FIG. 9C) of the plurality of protrusions 420 illustrated in FIG. 4 or FIG. 9C. In this case, the first conductive member may include the coupling part 1212 and the through-hole 1213, which correspond to the protrusion 420, to which the fifth coupling structure is applied.

According to the above-described various embodiments, the electronic device 100 may include at least one of the first coupling structure, the second coupling structure, the third coupling structure, the fourth coupling structure, and/or the fifth coupling structure.

The electronic device 100 according to an embodiment may include a plurality of coupling structures. For example, the electronic device 100 according to an embodiment may include a first coupling structure and a second coupling structure. In this case, the coupling parts 312 and 912 of the first conductive members 310 and 910 may include the stepped part 325 that are integrally formed and are spaced apart from each other, and the first hole 913, or may be separated from each other to be referenced as the first coupling part and the second coupling part. However, even when the coupling parts 312 and 912 are referenced as the first coupling part and the second coupling part, the coupling parts 312 and 912 necessarily have to be separated from each other, and even when the coupling parts 312 and 912 are integrally formed, they may be referenced as the first coupling part and the second coupling part for convenience of classification. Furthermore, the inner parts 321 and 921 of the second conductive members 320 and 920 may be integrally formed and be referenced as one inner part, and the end parts 323 and 923 may be referenced as the first end part and the second end part that extend from the one inner part. Furthermore, the connecting parts 322 and 922 that connect the end parts 323 and 923 and the one inner part may be referenced as the first connecting part and the second connecting part. In this regard, it may be understood that the electronic device 100 according to an embodiment may include at least one coupling structure and the at least one coupling structure includes at least one coupling part and at least one end part. Furthermore, it may be understood that the electronic device 100 according to an embodiment includes the one inner part of the second conductive member, and at least one connecting part that connects the at least one end part. Furthermore, it may be understood that the electronic device 100 according to an embodiment includes at least one conductive connection member that is disposed at a portion, at which the first conductive member and the second conductive member are coupled to each other to electrically connect them.

An electronic device (e.g., the electronic device 100 of FIG. 1) according to an embodiment of the disclosure includes a display (e.g., the display 101 of FIG. 2), a frame structure (e.g., the frame structure 140 of FIG. 3A) including a first conductive member (e.g., the first conductive member 310 of FIG. 3A) defining an external appearance of the electronic device and operated as an antenna element of the electronic device, a second conductive member (e.g., the second conductive member 320 of FIG. 3A) coupled and electrically connected to the first conductive member, and a nonconductive member (e.g., the nonconductive member 330 of FIG. 3A) that supports the display together with the second conductive member, a bonding layer (e.g., the bonding layer 360 of FIG. 3C) including a first layer (e.g., the first layer 361 of FIG. 3C) at least partially disposed between the first conductive member and the nonconductive member, and a second layer (e.g., the second layer 362 of FIG. 3C) at least partially disposed between the second conductive member and the nonconductive member, and at least one conductive connection member (e.g., the first conductive connection member 350 of FIG. 3C) disposed at a portion, at which the first conductive member and the second conductive member are coupled to each other, and contacting the first conductive member and the second conductive member.

In an embodiment, the first conductive member may include an outer part (e.g., the outer part 311 of FIG. 3C) defining a side surface of the electronic device, and a coupling part (e.g., the coupling part 312 of FIG. 3C) extending inwards from the outer part, the second conductive member may include an inner part (e.g., the inner part 321 of FIG. 3C) that supports the display, and at least one end part (e.g., the end part 323 of FIG. 3C) extending from the inner part toward the outer part of the first conductive member, and the coupling part of the first conductive member may be coupled to the at least one end part of the second conductive member.

In an embodiment, the at least one conductive connection member may include a first conductive connection member, the at least one end part of the second conductive member may include a first end part (e.g., the end part 323 of FIG. 3C), a stepped part (e.g., the stepped part 325 of FIG. 3C) may formed in the coupling part of the first conductive member, the first end part of the second conductive member may be seated on the stepped part, and the first conductive connection member may be disposed on the first end part of the second conductive member.

In an embodiment, the stepped part may be defined by a first surface (e.g., the first surface 3131 of FIG. 3C) of the coupling part, which contacts the first end part of the second conductive member, and a first side surface (e.g., the first side surface 312a of FIG. 3C) extending from a periphery of the first surface in a direction that is different from that of the first surface, and the first end part of the second conductive member may contacts the first surface, and is spaced apart from the first side surface.

In an embodiment, the first conductive member may include a first part (e.g., the first part 3501 of FIG. 3C) disposed on the first end part of the second conductive member, and a second part (e.g., the second part 3502 of FIG. 3C) extending from the first part, and the second part of the first conductive connection member may be at least partially disposed in a first gap (e.g., the first gap 340 of FIG. 3C), by which the first end part of the second conductive member is spaced apart from the first side surface.

In an embodiment, the nonconductive member may surround the entire first conductive member.

In an embodiment, the at least one conductive connection member may include a second conductive connection member (e.g., the second conductive connection member 352 of FIG. 7), the second conductive member includes a connecting part (e.g., the connecting part 322 of FIG. 7) connecting the first end part and the inner part, and the second conductive connection member may contact the coupling part of the first conductive member and the connecting part of the second conductive member.

In an embodiment, the coupling part of the first conductive member may be spaced apart from the connecting part of the second conductive member, and the second conductive connection member may be at least partially disposed in a second gap (e.g., the second gap 342 of FIG. 7), by which the coupling part and the connecting part are spaced apart from each other.

In an embodiment, the at least one conductive connection member includes a second conductive connection member (e.g., the first conductive connection member 950 of FIG. 9A), the at least one end part of the second conductive member includes a second end part (e.g., the end part 923 of FIG. 9A), a first opening (e.g., the opening OP of FIG. 9A) and a first hole (e.g., the first hole 913 of FIG. 9A) communicated with the first opening and extending into an interior of the coupling part are formed in the coupling part of the first conductive member, the second conductive connection member may be disposed in the first hole, and the second end part of the second conductive member may be at least partially inserted into the first hole to contact the second conductive connection member.

In an embodiment, a second opening (e.g., the second opening OP2 of FIG. 10A) and a second hole (e.g., the second hole 1015 of FIG. 10A) may be formed in the coupling part of the first conductive member, the second hole may extend from the first hole (e.g., the first hole 1013 of FIG. 10A) in a direction that is different from that of the first hole and may be communicated with the second opening, and the second conductive connection member may be at least partially disposed in the first hole and the second hole.

In an embodiment, the at least one end part of the second conductive member includes a second end part (e.g., the end part 1123 of FIG. 11B), the at least one conductive connection member includes a second conductive connection member (e.g., the first conductive connection member 1150 of FIG. 11B), the second conductive connection member may be disposed on the second end part, and the nonconductive member may not be formed on the second conductive connection member.

In an embodiment, the at least one conductive connection member includes a second conductive connection member (e.g., the first conductive connection member 1250 of FIG. 12B), a first opening (e.g., the third opening OP3 of FIG. 12B), a second opening (e.g., the fourth opening OP4 of FIG. 12B), and a through-hole (e.g., the through-hole 1213 of FIG. 12B) that communicates the first opening and the second opening are formed in the coupling part (e.g., the coupling part 1212 of FIG. 12) of the first conductive member, the at least one end part of the second conductive member includes a second end part (e.g., the end part 1233 of FIG. 12) extending in a direction that is different from that of the inner part and inserted into the through-hole, the second end part may pass through the second opening and extends to the first opening, and the second conductive connection member may be at least partially disposed on a surface (e.g., the upper surface 1212c of FIG. 12B) of the coupling part, in which the first opening is formed, and the second end part to contact the coupling part of the first conductive member and the second end part of the second conductive member.

In an embodiment, the entire second conductive connection member may be surrounded by the nonconductive member.

In an embodiment, the at least one conductive connection member may include a solution containing conductive particles, a metal deposition layer, or a conductive film.

In an embodiment, the electronic device may include a bonding part (e.g., the bonding part 315 of FIG. 3C) formed between the first conductive member and the second conductive member, and the bonding part may be formed through welding.

An electronic device (e.g., the electronic device 100 of FIG. 1) according to an embodiment of the disclosure includes a display (e.g., the display 101 of FIG. 2), a frame structure, the frame structure includes a first conductive member (e.g., the first conductive member 310 of FIG. 3C) operated as an antenna element of the electronic device, the first conductive member includes an outer part (e.g., the outer part 311 of FIG. 3C) defining a side surface (e.g., the third surface 100C of FIG. 3C) of the electronic device, and a coupling part (e.g., the coupling part 312 of FIG. 3C) extending from the outer part to an inside of the electronic device, a second conductive member (e.g., the second conductive member 320 of FIG. 3C) electrically connected to the first conductive member, the second conductive member includes an inner part (e.g., the inner part 321 of FIG. 3C) that supports the display, and at least one end part (e.g., the end part 323 of FIG. 3C) extending from the inner part and coupled to the coupling part of the first conductive member, and a nonconductive member (e.g., the nonconductive member 330 of FIG. 3C) at least partially surrounding the first conductive member and the second conductive member, and that supports the display together with the second conductive member, a bonding layer (e.g., the bonding layer 360 of FIG. 3C) at least partially disposed between the first conductive member and the nonconductive member, and at least partially between the second conductive member and the nonconductive member, and at least one conductive connection member (e.g., the first conductive connection member 350 of FIG. 3C) disposed at a portion, at which the coupling part of the first conductive member and the at least one end part of the second conductive member are coupled to each other, and contacting the first conductive member and the second conductive member.

In an embodiment, the at least one conductive connection member may include a first conductive connection member, the at least one end part of the second conductive member may include a first end part (e.g., the end part 323 of FIG. 3C), a stepped part (e.g., the stepped part 325 of FIG. 3C), in which the first end part is seated, is formed in the coupling part of the first conductive member, wherein the stepped part is defined by a first surface (e.g., the first surface 3131 of FIG. 3C) partially contacting the first end part, and a first side surface (e.g., the first side surface 312a of FIG. 3C) extending from a periphery of the first surface in a direction that is different from that of the first surface, and spaced apart from the first end part, and the first conductive connection member may include a first part (e.g., the first part 3501 of FIG. 3C) disposed on the first end part of the second conductive member, and extending to the first side surface, and a second part (e.g., the second part 3502 of FIG. 3C) extending from the first part between the first side surface and the first end part.

In an embodiment, the at least one conductive connection member may include a second conductive connection member (e.g., the first conductive connection member 950 of FIG. 9A), the at least one end part of the second conductive member may include a second end part (e.g., the end part 923 of FIG. 9A), a hole (e.g., the first hole 913 of FIG. 9C) may formed in the coupling part of the first conductive member, one side of the hole is opened through an opening part (e.g., the opening OP of FIG. 9A) formed on a surface of the coupling part, and an opposite side of the hole is closed, the second end part of the second conductive member may be partially disposed in the hole, and the second conductive connection member may be disposed between the opposite side of the hole and the second end part, in the hole.

In an embodiment, the at least one conductive connection member may include a third conductive connection member, the at least one end part of the second conductive member may include a third end part (e.g., the end part 1023 of FIG. 10A), a first hole (e.g., the first hole 1013 of FIG. 10A) and a second hole (e.g., the second hole 1015 of FIG. 10A) communicated with one side of the first hole are formed in the coupling part of the first conductive member, the first hole may extend from a first opening part (e.g., the first opening OP1 of FIG. 10A) formed on a surface of the coupling part to the one side in a first direction that faces an interior of the coupling part, the second hole may extend from the one side of the first hole to a second opening part (e.g., the second opening OP2 of FIG. 10A) formed on a surface of the coupling part in a second direction that is different from the first direction, the third end part of the second conductive member may be at least partially disposed in the first hole, and the third conductive connection member may be at least partially formed in the first hole and/or the second hole to contact the third end part disposed in the first hole and the coupling part.

In an embodiment, the at least one conductive connection member includes a fourth conductive connection member (e.g., the first conductive connection member 1250 of FIG. 12B), the at least one end part of the second conductive member includes a fourth end part (e.g., the end part 1223 of FIG. 12B), the coupling part of the first conductive member may include a third opening (e.g., the third opening OP3 of FIG. 12B) formed on a first surface (e.g., the upper surface 1212c of FIG. 12B) of the coupling part, a fourth opening (e.g., the fourth opening OP4 of FIG. 12B) formed on a second surface that is different from the first surface of the coupling part, and a through-hole (e.g., the through-hole 1213 of FIG. 12B) that communicates the third opening and the fourth opening, the fourth end part may extend in a direction that is different from that of the inner part and is inserted into the through-hole, and passes through the fourth opening of the through-hole and extends to the third opening, and the fourth conductive connection member may be at least partially disposed on the first surface of the coupling part, in which the third opening is formed, to cover the fourth end part that extends to the third opening.

In an embodiment, the coupling part may include a second side surface and an upper surface that extends from a periphery of the first side surface to the outer part.

In an embodiment, the first hole may be formed between the first side surface and the second side surface.

In an embodiment, the first side surface may extend on a first axis and the second side surface may extend on a second axis. The first hole may extend on a third axis that is different from the first axis and the second axis.

FIG. 13 is a block diagram illustrating an electronic device in a network environment according to an embodiment of the disclosure.

Referring to FIG. 13, an electronic device 1301 in a network environment 1300 may communicate with an electronic device 1302 via a first network 1398 (e.g., a short-range wireless communication network), or at least one of an electronic device 1304 or a server 1308 via a second network 1399 (e.g., a long-range wireless communication network). According to an embodiment, the electronic device 1301 may communicate with the electronic device 1304 via the server 1308. According to an embodiment, the electronic device 1301 may include a processor 1320, memory 1330, an input module 1350, a sound output module 1355, a display module 1360, an audio module 1370, a sensor module 1376, an interface 1377, a connecting terminal 1378, a haptic module 1379, a camera module 1380, a power management module 1388, a battery 1389, a communication module 1390, a subscriber identification module (SIM) 1396, or an antenna module 1397. In some embodiments, at least one of the components (e.g., the connecting terminal 1378) may be omitted from the electronic device 1301, or one or more other components may be added in the electronic device 1301. In some embodiments, some of the components (e.g., the sensor module 1376, the camera module 1380, or the antenna module 1397) may be implemented as a single component (e.g., the display module 1360).

The processor 1320 may execute, for example, software (e.g., a program 1340) to control at least one other component (e.g., a hardware or software component) of the electronic device 1301 coupled with the processor 1320, and may perform various data processing or computation. According to one embodiment, as at least part of the data processing or computation, the processor 1320 may store a command or data received from another component (e.g., the sensor module 1376 or the communication module 1390) in volatile memory 1332, process the command or the data stored in the volatile memory 1332, and store resulting data in non-volatile memory 1334. According to an embodiment, the processor 1320 may include a main processor 1321 (e.g., a central processing unit (CPU) or an application processor (AP)), or an auxiliary processor 1323 (e.g., a graphics processing unit (GPU), a neural processing unit (NPU), an image signal processor (ISP), a sensor hub processor, or a communication processor (CP)) that is operable independently from, or in conjunction with, the main processor 1321. For example, when the electronic device 1301 includes the main processor 1321 and the auxiliary processor 1323, the auxiliary processor 1323 may be adapted to consume less power than the main processor 1321, or to be specific to a specified function. The auxiliary processor 1323 may be implemented as separate from, or as part of the main processor 1321.

The auxiliary processor 1323 may control at least some of functions or states related to at least one component (e.g., the display module 1360, the sensor module 1376, or the communication module 1390) among the components of the electronic device 1301, instead of the main processor 1321 while the main processor 1321 is in an inactive (e.g., sleep) state, or together with the main processor 1321 while the main processor 1321 is in an active state (e.g., executing an application). According to an embodiment, the auxiliary processor 1323 (e.g., an image signal processor or a communication processor) may be implemented as part of another component (e.g., the camera module 1380 or the communication module 1390) functionally related to the auxiliary processor 1323. According to an embodiment, the auxiliary processor 1323 (e.g., the neural processing unit) may include a hardware structure specified for artificial intelligence model processing. An artificial intelligence model may be generated by machine learning. Such learning may be performed, e.g., by the electronic device 1301 where the artificial intelligence is performed or via a separate server (e.g., the server 1308). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1330 may store various data used by at least one component (e.g., the processor 1320 or the sensor module 1376) of the electronic device 1301. The various data may include, for example, software (e.g., the program 1340) and input data or output data for a command related thereto. The memory 1330 may include the volatile memory 1332 or the non-volatile memory 1334.

The program 1340 may be stored in the memory 1330 as software, and may include, for example, an operating system (OS) 1342, middleware 1344, or an application 1346.

The input module 1350 may receive a command or data to be used by another component (e.g., the processor 1320) of the electronic device 1301, from the outside (e.g., a user) of the electronic device 1301. The input module 1350 may include, for example, a microphone, a mouse, a keyboard, a key (e.g., a button), or a digital pen (e.g., a stylus pen).

The sound output module 1355 may output sound signals to the outside of the electronic device 1301. The sound output module 1355 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1360 may visually provide information to the outside (e.g., a user) of the electronic device 1301. The display module 1360 may include, for example, a display, a hologram device, or a projector and control circuitry to control a corresponding one of the display, hologram device, and projector. According to an embodiment, the display module 1360 may include a touch sensor adapted to detect a touch, or a pressure sensor adapted to measure the intensity of force incurred by the touch.

The audio module 1370 may convert a sound into an electrical signal and vice versa. According to an embodiment, the audio module 1370 may obtain the sound via the input module 1350, or output the sound via the sound output module 1355 or a headphone of an external electronic device (e.g., an electronic device 1302) directly (e.g., wiredly) or wirelessly coupled with the electronic device 1301.

The sensor module 1376 may detect an operational state (e.g., power or temperature) of the electronic device 1301 or an environmental state (e.g., a state of a user) external to the electronic device 1301, and then generate an electrical signal or data value corresponding to the detected state. According to an embodiment, the sensor module 1376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1377 may support one or more specified protocols to be used for the electronic device 1301 to be coupled with the external electronic device (e.g., the electronic device 1302) directly (e.g., wiredly) or wirelessly. According to an embodiment, the interface 1377 may include, for example, a high definition multimedia interface (HDMI), a universal serial bus (USB) interface, a secure digital (SD) card interface, or an audio interface.

A connecting terminal 1378 may include a connector via which the electronic device 1301 may be physically connected with the external electronic device (e.g., the electronic device 1302). According to an embodiment, the connecting terminal 1378 may include, for example, a HDMI connector, a USB connector, a SD card connector, or an audio connector (e.g., a headphone connector).

The haptic module 1379 may convert an electrical signal into a mechanical stimulus (e.g., a vibration or a movement) or electrical stimulus which may be recognized by a user via his tactile sensation or kinesthetic sensation. According to an embodiment, the haptic module 1379 may include, for example, a motor, a piezoelectric element, or an electric stimulator.

The camera module 1380 may capture a still image or moving images. According to an embodiment, the camera module 1380 may include one or more lenses, image sensors, image signal processors, or flashes.

The power management module 1388 may manage power supplied to the electronic device 1301. According to one embodiment, the power management module 1388 may be implemented as at least part of, for example, a power management integrated circuit (PMIC).

The battery 1389 may supply power to at least one component of the electronic device 1301. According to an embodiment, the battery 1389 may include, for example, a primary cell which is not rechargeable, a secondary cell which is rechargeable, or a fuel cell.

The communication module 1390 may support establishing a direct (e.g., wired) communication channel or a wireless communication channel between the electronic device 1301 and the external electronic device (e.g., the electronic device 1302, the electronic device 1304, or the server 1308) and performing communication via the established communication channel. The communication module 1390 may include one or more communication processors that are operable independently from the processor 1320 (e.g., the application processor (AP)) and supports a direct (e.g., wired) communication or a wireless communication. According to an embodiment, the communication module 1390 may include a wireless communication module 1392 (e.g., a cellular communication module, a short-range wireless communication module, or a global navigation satellite system (GNSS) communication module) or a wired communication module 1394 (e.g., a local area network (LAN) communication module or a power line communication (PLC) module). A corresponding one of these communication modules may communicate with the external electronic device via the first network 1398 (e.g., a short-range communication network, such as Bluetooth™ wireless-fidelity (Wi-Fi) direct, or infrared data association (IrDA)) or the second network 1399 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1392 may identify and authenticate the electronic device 1301 in a communication network, such as the first network 1398 or the second network 1399, using subscriber information (e.g., international mobile subscriber identity (IMSI)) stored in the subscriber identification module 1396.

The wireless communication module 1392 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1392 may support a high-frequency band (e.g., the millimeter wave (mmWave) band) to achieve, e.g., a high data transmission rate. The wireless communication module 1392 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1392 may support various requirements specified in the electronic device 1301, an external electronic device (e.g., the electronic device 1304), or a network system (e.g., the second network 1399). According to an embodiment, the wireless communication module 1392 may support a peak data rate (e.g., 20 Gbps or more) for implementing eMBB, loss coverage (e.g., 1364 dB or less) for implementing mMTC, or U-plane latency (e.g., 0.5 ms or less for each of downlink (DL) and uplink (UL), or a round trip of 13 ms or less) for implementing URLLC.

The antenna module 1397 may transmit or receive a signal or power to or from the outside (e.g., the external electronic device) of the electronic device 1301. According to an embodiment, the antenna module 1397 may include an antenna including a radiating element composed of a conductive material or a conductive pattern formed in or on a substrate (e.g., a printed circuit board (PCB)). According to an embodiment, the antenna module 1397 may include a plurality of antennas (e.g., array antennas). In such a case, at least one antenna appropriate for a communication scheme used in the communication network, such as the first network 1398 or the second network 1399, may be selected, for example, by the communication module 1390 (e.g., the wireless communication module 1392) from the plurality of antennas. The signal or the power may then be transmitted or received between the communication module 1390 and the external electronic device via the selected at least one antenna. According to an embodiment, another component (e.g., a radio frequency integrated circuit (RFIC)) other than the radiating element may be additionally formed as part of the antenna module 1397.

According to various embodiments, the antenna module 1397 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1301 and the external electronic device 1304 via the server 1308 coupled with the second network 1399. Each of the electronic devices 1302 or 1304 may be a device of a same type as, or a different type, from the electronic device 1301. According to an embodiment, all or some of operations to be executed at the electronic device 1301 may be executed at one or more of the external electronic devices 1302 or 1304, or the server 1308. For example, if the electronic device 1301 should perform a function or a service automatically, or in response to a request from a user or another device, the electronic device 1301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1301. The electronic device 1301 may provide the outcome, with or without further processing of the outcome, as at least part of a reply to the request. To that end, a cloud computing, distributed computing, mobile edge computing (MEC), or client-server computing technology may be used, for example. The electronic device 1301 may provide ultra low-latency services using, e.g., distributed computing or mobile edge computing. In another embodiment, the external electronic device 1304 may include an internet-of-things (IoT) device. The server 1308 may be an intelligent server using machine learning and/or a neural network. According to an embodiment, the external electronic device 1304 or the server 1308 may be included in the second network 1399. The electronic device 1301 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in another aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1340) including one or more instructions that are stored in a storage medium (e.g., internal memory 1336 or external memory 1338) that is readable by a machine (e.g., the electronic device 1301). For example, a processor (e.g., the processor 1320) of the machine (e.g., the electronic device 1301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a display;
   a frame structure including a first conductive member defining an external appearance of the electronic device and operated as an antenna element of the electronic device, a second conductive member coupled and electrically connected to the first conductive member, and a nonconductive member configured to support the display together with the second conductive member;
   a bonding layer including a first layer at least partially disposed between the first conductive member and the nonconductive member, and a second layer at least partially disposed between the second conductive member and the nonconductive member; and
   at least one conductive connection member disposed at a portion at which the first conductive member and the second conductive member are coupled to each other, the at least one conductive connection member contacting the first conductive member and the second conductive member.

2. The electronic device of claim 1,
   wherein the first conductive member includes an outer part defining a side surface of the electronic device, and a coupling part extending inwards from the outer part,
   wherein the second conductive member includes an inner part configured to support the display, and at least one end part extending from the inner part toward the outer part of the first conductive member, and
   wherein the coupling part of the first conductive member is coupled to the at least one end part of the second conductive member.

3. The electronic device of claim 2,
   wherein the at least one conductive connection member includes a first conductive connection member,
   wherein the at least one end part of the second conductive member includes a first end part,
   wherein a stepped part is formed in the coupling part of the first conductive member,
   wherein the first end part of the second conductive member is seated on the stepped part, and
   wherein the first conductive connection member is disposed on the first end part of the second conductive member.

4. The electronic device of claim 3,
   wherein the stepped part is defined by:
   a first surface of the coupling part, which contacts the first end part of the second conductive member, and
   a first side surface extending from a periphery of the first surface in a direction that is different from that of the first surface, and
   wherein the first end part of the second conductive member contacts the first surface, and is spaced apart from the first side surface.

5. The electronic device of claim 4,
   wherein the first conductive connection member includes:
   a first part disposed on the first end part of the second conductive member, and
   a second part extending from the first part, and
   wherein the second part of the first conductive connection member is at least partially disposed in a first gap, by which the first end part of the second conductive member is spaced apart from the first side surface.

6. The electronic device of claim 5, wherein the nonconductive member surrounds an entirety of the first conductive member.

7. The electronic device of claim 3,
   wherein the at least one conductive connection member includes a second conductive connection member,
   wherein the second conductive member includes a connecting part connecting the first end part and the inner part, and
   wherein the second conductive connection member contacts the coupling part of the first conductive member and the connecting part of the second conductive member.

8. The electronic device of claim 7,
   wherein the coupling part of the first conductive member is spaced apart from the connecting part of the second conductive member, and
   wherein the second conductive connection member is at least partially disposed in a second gap, by which the coupling part and the connecting part are spaced apart from each other.

9. The electronic device of claim 2,
   wherein the at least one conductive connection member includes a second conductive connection member,
   wherein the at least one end part of the second conductive member includes a second end part, wherein a first opening and a first hole communicated with the first opening and extending into an interior of the coupling part are formed in the coupling part of the first conductive member, wherein the second conductive connection member is disposed in the first hole, and wherein the second end part of the second conductive member is at least partially inserted into the first hole to contact the second conductive connection member.

10. The electronic device of claim 9, wherein a second opening and a second hole are formed in the coupling part of the first conductive member, wherein the second hole extends from the first hole in a direction that is different from that of the first hole and is communicated with the second opening, and wherein the second conductive connection member is at least partially disposed in the first hole and the second hole.

11. The electronic device of claim 2, wherein the at least one end part of the second conductive member includes a second end part, wherein the at least one conductive connection member includes a second conductive connection member, wherein the second conductive connection member is disposed on the second end part, and wherein the nonconductive member is not formed on the second conductive connection member.

12. The electronic device of claim 2, wherein the at least one conductive connection member includes a second conductive connection member, wherein a first opening, a second opening, and a through-hole that communicates the first opening and the second opening are formed in the coupling part of the first conductive member, wherein the at least one end part of the second conductive member includes a second end part extending in a direction that is different from that of the inner part and inserted into the through-hole, wherein the second end part passes through the second opening and extends to the first opening, and wherein the second conductive connection member is at least partially disposed on a surface of the coupling part, in which the first opening is formed, and the second end part to contact the coupling part of the first conductive member and the second end part of the second conductive member.

13. The electronic device of claim 12, wherein an entirety of the second conductive connection member is surrounded by the nonconductive member.

14. The electronic device of claim 1, wherein the at least one conductive connection member includes:
a solution containing conductive particles;
a metal deposition layer; or
a conductive film.

15. The electronic device of claim 1, comprising:
a bonding part formed between the first conductive member and the second conductive member, wherein the bonding part is formed through welding.

16. An electronic device comprising:
a display;
a frame structure including:
a first conductive member operated as an antenna element of the electronic device, the first conductive member including an outer part defining a side surface of the electronic device, and a coupling part extending from the outer part to an inside of the electronic device, a second conductive member electrically connected to the first conductive member, the second conductive member including an inner part configured to support the display, and at least one end part extending from the inner part and coupled to the coupling part of the first conductive member, and a nonconductive member at least partially surrounding the first conductive member and the second conductive member, and configured to support the display together with the second conductive member;

a bonding layer at least partially disposed between the first conductive member and the nonconductive member, and at least partially between the second conductive member and the nonconductive member; and at least one conductive connection member disposed at a portion at which the coupling part of the first conductive member and the at least one end part of the second conductive member are coupled to each other, the at least one conductive connection member contacting the first conductive member and the second conductive member.

17. The electronic device of claim 16, wherein the at least one conductive connection member includes a first conductive connection member, wherein the at least one end part of the second conductive member includes a first end part, wherein a stepped part, in which the first end part is seated, is formed in the coupling part of the first conductive member, wherein the stepped part is defined by:
a first surface partially contacting the first end part, and
a first side surface extending from a periphery of the first surface in a direction that is different from that of the first surface, and spaced apart from the first end part, and wherein the first conductive connection member includes:
a first part disposed on the first end part of the second conductive member, and extending to the first side surface, and
a second part extending from the first part between the first side surface and the first end part.

18. The electronic device of claim 17, wherein the at least one conductive connection member includes a second conductive connection member, wherein the at least one end part of the second conductive member includes a second end part, wherein a hole is formed in the coupling part of the first conductive member, wherein one side of the hole is opened through an opening part formed on a surface of the coupling part, and an opposite side of the hole is closed, wherein the second end part of the second conductive member is partially disposed in the hole, and wherein the second conductive connection member is disposed between the opposite side of the hole and the second end part, in the hole.

19. The electronic device of claim 18, wherein the at least one conductive connection member includes a third conductive connection member, wherein the at least one end part of the second conductive member includes a third end part, a first hole and a second hole communicated with one side of the first hole are formed in the coupling part of the first conductive member, wherein the first hole extends from a first opening part formed on a surface of the coupling part to the one side in a first direction that faces an interior of the coupling part, wherein the second hole extends from the one side of the first hole to a second opening part formed on a surface of the coupling part in a second direction that is different from the first direction, wherein the third end part of the second conductive member is at least partially disposed in the first hole, and wherein the third conductive connection member is at least partially formed in at least one of the first hole or the second hole to contact the third end part disposed in the first hole and the coupling part.

20. The electronic device of claim 19, wherein the at least one conductive connection member includes a fourth conductive connection member, wherein the at least one end part of the second conductive member includes a fourth end part, wherein the coupling part of the first conductive member includes a third opening formed on a first surface of the coupling part, a fourth opening formed on a second surface that is different from the first surface of the coupling part, and a through-hole that communicates the third opening and the fourth opening, wherein the fourth end part extends in a direction that is different from that of the inner part and is inserted into the through-hole, and passes through the fourth opening of the through-hole and extends to the third opening, and wherein the fourth conductive connection member is at least partially disposed on the first surface of the coupling part, in which the third opening is formed, to cover the fourth end part that extends to the third opening.

* * * * *